(12) United States Patent
Matsushita

(10) Patent No.: US 6,608,922 B1
(45) Date of Patent: Aug. 19, 2003

(54) METHOD OF RECOGNIZING CONNECTION OF RECONSTRUCTING PATTERN IN PRINTED WIRING BOARD

(75) Inventor: Hideharu Matsushita, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/428,104

(22) Filed: Oct. 27, 1999

(30) Foreign Application Priority Data

Dec. 15, 1998 (JP) .......................................... 10-356166

(51) Int. Cl.⁷ ................................................ G06K 9/00
(52) U.S. Cl. ........................................ 382/147; 716/15
(58) Field of Search .................. 716/15, FOR 489–491; 382/147

(56) References Cited

U.S. PATENT DOCUMENTS 5,812,413 A * 9/1998 Matsushita .................... 716/15
5,847,968 A * 12/1998 Miura et al. ................... 716/8

FOREIGN PATENT DOCUMENTS

| JP | 61080892 | 4/1986 |
| JP | 62247464 | 10/1987 |
| JP | 03033982 | 2/1991 |
| JP | 09198428 | 7/1997 |

* cited by examiner

*Primary Examiner*—Leo Boudreau
*Assistant Examiner*—Tom Y. Lu
(74) *Attorney, Agent, or Firm*—Katten Muchin Zavis Rosenman

(57) ABSTRACT

In a method of recognizing a connection of a reconstructing pattern in a printed wiring board when a circuit modification process after a printed board wiring is performed by a physical cutting, a jumper, or the like, a physical connection table is prepared which has a forward connecting direction address (KP address) indicating a forward connection order of connecting elements (a land, a via, a manual land, an external land, a line, and a jumper) with a predetermined connecting element (the land) being made a starting point and a backward connecting direction address (NKP address) indicating a backward connection order to the forward connection order, based on a pattern input information table. Also, a large area pattern is regarded as one of a peripheral line, a punching line, an imaginary line, and a cutting line of the above-mentioned lines, whereby the connecting elements are made to include the large area pattern.

14 Claims, 30 Drawing Sheets

| ARRANGE-MENT ADDRESS | CONNECTING ELEMENT | CONNECTING POINTER (WKPTR) | CONNECTING CLASSIFI-CATION (FLG) |
|---|---|---|---|
| 1 | A | −1 (REFERENCE) | −1 |
| 2 | B | 4 | 2 |
| 3 | C | 6 | 2 |
| 4 | V1 | 1 | 2 |
| 5 | V2 | 2 | 2 |

20

| ARRANGE-MENT ADDRESS | CONNECTING ELEMENT | CONNECTING POINTER (WKPTR) | CONNECTING CLASSIFI-CATION (FLG) |
|---|---|---|---|
| 1 | L1 | 1 | 1 |
| 2 | L2 | 4 | 1 |
| 3 | L3 | 4 | 1 |
| 4 | L4 | 5 | 2 |
| 5 | L5 | 3 | 2 |
| 6 | L6 | 5 | 1 |

30

| ARRANGE-MENT ADDRESS | CONNECTING ELEMENT | KP | NKP |
|---|---|---|---|
| 1 | A | −1 (REFERENCE) | 6 |
| 2 | B | 8 | 9,10 |
| 3 | C | 9 | 11 |
| 4 | D | 10 | 12 |
| 5 | E | 11 | — |
| 6 | L1 | 1 | 7 |
| 7 | L2 | 6 | 8 |
| 8 | L3 | 7 | 2 |
| 9 | L4 | 2 | 3 |
| 10 | L5 | 2 | 4 |
| 11 | L6 | 3 | 5 |
| 12 | L7 | 4 | — |

50

| ARRANGE-MENT ADDRESS | CONNECTING ELEMENT | KP | FIRST KP | NEW KP |
|---|---|---|---|---|
| 1 | A | −1 (REFERENCE) | 4 | UNCHANGED |
| 2 | B | 6 | | 6 |
| 3 | C | 5 | −1 (REFERENCE) | UNCHANGED |
| 4 | L1 | 1 | 5 | UNCHANGED |
| 5 | L2 | 4 | 3 | UNCHANGED |
| 6 | L3 | 4 | | 5 |
| 7 | L4 | 3 | | 3 |
| 8 | L5 | 7 | | 7 |

| ARRANGE-MENT ADDRESS | CONNECT-ING ELEMENT | WHEN "C" IS REFERENCE | | WHEN "A" IS REFERENCE | | | |
|---|---|---|---|---|---|---|---|
| | | | | DELETE L3,L4 | | | |
| | | KP | NKP | KP | NKP | KP | NKP |
| 1 | C | −1 (REFERENCE) | 9,10 | −1 (REFERENCE) | — | −1 | — |
| 2 | A | 7 | — | −1 | | −1 (REFERENCE) | 7 |
| 3 | B | 9 | 8 | −1 | | 8 | — |
| 4 | D | 11 | 12,13 | −1 | | −1 | |
| 5 | E | 13 | — | −1 | | −1 | |
| 6 | F | 12 | — | −1 | | −1 | |
| 7 | L1 | 8 | 2 | −1 | | 2 | 8 |
| 8 | L2 | 3 | 7 | −1 | | 7 | 3 |
| 9 | L3 | 1 | 3 | −1 | | −1 | |
| 10 | L4 | 1 | 11 | −1 | | −1 | |
| 11 | L5 | 10 | 4 | −1 | | −1 | |
| 12 | L6 | 4 | 6 | −1 | | −1 | |
| 13 | L7 | 4 | 5 | −1 | | −1 | |

FIG.15A
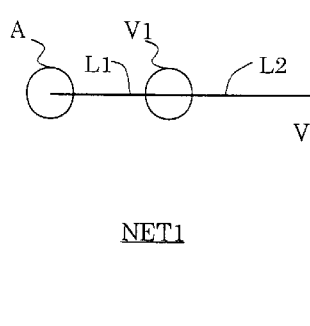
NET1
FIG.15B
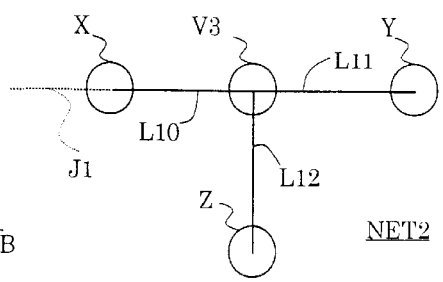
NET2
FIG.15C
50_1
| ARRANGE-MENT ADDRESS | CONNECTING ELEMENT | KP | NKP |
|---|---|---|---|
| 1 | A | -1 (REFERENCE) | 6 |
| 2 | B | 9 | — |
| 3 | C | 10 | — |
| 4 | V1 | 6 | 7 |
| 5 | V2 | 8 | 9,10,(11) |
| 6 | L1 | 1 | 4 |
| 7 | L2 | 4 | 8 |
| 8 | L3 | 7 | 5 |
| 9 | L4 | 5 | 2 |
| 10 | L5 | 5 | 3 |
| 11 | J1(V2-X) | 5 | 12 |
| 12 | X | 11 | 16 |
| 13 | Z | 17 | — |
| 14 | Y | 18 | — |
| 15 | V3 | 16 | 17,18 |
| 16 | L10 | 12 | 15 |
| 17 | L11 | 15 | 13 |
| 18 | L10 | 15 | 14 |
FIG.15D
50_2
| ARRANGE-MENT ADDRESS | CONNECTING ELEMENT | KP | NKP |
|---|---|---|---|
| 1 | X | -1 (REFERENCE) | 5 |
| 2 | Y | 6 | — |
| 3 | Z | 7 | — |
| 4 | V3 | 5 | 6,7 |
| 5 | L10 | 1 | 4 |
| 6 | L11 | 4 | 2 |
| 7 | L12 | 4 | 3 |

| ARRANGE-MENT ADDRESS | CONNECTING ELEMENT | KP | NKP |
|---|---|---|---|
| 1 | B | -1 (REFERENCE) | 8,10 |
| 2 | A | 4 | — |
| 3 | C | 12 | 7 |
| 4 | L1 | 5 | 2 |
| 5 | L2 | 9 | 4 |
| 6 | L3 | 8 | — |
| 7 | L4 | 3 | — |
| 8 | L5 | 1 | 6 |
| 9 | L6 | 10 | 5 |
| 10 | L7 | 1 | 9,11 |
| 11 | L8 | 10 | 12 |
| 12 | L9 | 11 | 3 |

50

—— SINGLE SIDED PATTERN
------ DOUBLE SIDED PATTERN

WLND (FLG=1) 20

| ARRANGE-MENT ADDRESS | CONNECTING ELEMENT | WKPTR | FLG |
|---|---|---|---|
| 1 | A | −1 (REFERENCE) | |
| 2 | B | 2 | 2 |
| 3 | C | 6 | 2 |

WLIN (FLG=2) 30

| ARRANGE-MENT ADDRESS | CONNECTING ELEMENT | WKPTR | FLG |
|---|---|---|---|
| 1 | L1 | 1 | 1 |
| 2 | L2 | 1 | 2 |
| 3 | L3 | 2 | 1 |
| 4 | L4 | 3 | 2 |
| 5 | L5 | 1 | 1 |
| 6 | L6 | 5 | 2 |
| 7 | L7 | 3 | 1 |

| ARRANGE-MENT ADDRESS | CONNECTING ELEMENT | KP | NKP | NEW KP | NEW NKP |
|---|---|---|---|---|---|
| 1 | A | 0 (REFERENCE) | 4,8 | 4 | 8 |
| 2 | B | 5 | 6 | −1 (REFERENCE) | 5,6 |
| 3 | C | 9 | 10 | 9 | 10 |
| 4 | L1 | 1 | 5 | 5 | 1 |
| 5 | L2 | 4 | 2 | 2 | 4 |
| 6 | L3 | 2 | 7 | 2 | 7 |
| 7 | L4 | 6 | − | 6 | − |
| 8 | L5 | 1 | 9 | 1 | 9 |
| 9 | L6 | 8 | 3 | 8 | 3 |
| 10 | L7 | 3 | − | 3 | − |

| ARRANGE-MENT ADDRESS | CONNECTING ELEMENT | KP | NKP |
|---|---|---|---|
| 1 | A | −1 (REFERENCE) | 6,8,9,12 |
| 2 | B | 10 | — |
| 3 | L1 | 6 | — |
| 4 | L2 | 6 | — |
| 5 | L3 | 8 | — |
| 6 | L4 | 1 | 3,4 |
| 7 | L5 | 9 | — |
| 8 | L6 | 1 | 5,11 |
| 9 | L7 | 1 | 7,13 →CUT |
| 10 | L8 | 9 | 2 |
| 11 | L9 | 8 | — |
| 12 | L10 | 1 | 14,15 |
| 13 | L11 | 9 | — |
| 14 | L12 | 12 | — |
| 15 | L13 | 12 | — |

FIG.25

| ARRANGEMENT ADDRESS | CONNECTING ELEMNT | KP | NKP |
|---|---|---|---|
| 1 | A | −1(REFERENCE) | 7,9,10,13 |
| 2 | B | 11 | 17 |
| 3 | C | 25 | 27 |
| 4 | L1 | 7 | 6 |
| 5 | L2 | 7 | 8 |
| 6 | L3 | 4 | 12 |
| 7 | L4 | 1 | 4,5 |
| 8 | L5 | 5 | — |
| 9 | L6 | 1 | — |
| 10 | L7 | 1 | — |
| 11 | L8 | 14 | 2 |
| 12 | L9 | 6 | 15 |
| 13 | L10 | 1 | — |
| 14 | L11 | 16 | 11 |
| 15 | L12 | 12 | 16 |
| 16 | L13 | 15 | 14 |
| 17 | L20 | 2 | 18 |
| 18 | L21 | 17 | 19,21 |
| 19 | L22 | 18 | 20,22 |
| 20 | L23 | 19 | 23 |
| 21 | L24 | 18 | 24,26 |
| 22 | L25 | 19 | — |
| 23 | L26 | 20 | 25 |
| 24 | L27 | 21 | — |
| 25 | L28 | 23 | 3 |
| 26 | L29 | 21 | 29 |
| 27 | L30 | 3 | 30 |
| 28 | L31 | 30 | — |
| 29 | L32 | 26 | — |
| 30 | L33 | 27 | 28 |

| ARRANGEMENT ADDRESS | CONNECTING ELEMENT | KP (FORWARD DIRECTION) |
|---|---|---|
| 1 | A | -1 (REFERENCE) |
| 2 | B | 7 |
| 3 | C | 9 |
| 4 | D | 8 |
| 5 | V1 | 6 |
| 6 | L1 | 1 |
| 7 | L2 | 5 |
| 8 | L3 | 2 |
| 9 | L4 | 2 |
| 10 | L5 | 3 |
| 11 | L6 | 4 |

METHOD OF RECOGNIZING CONNECTION OF RECONSTRUCTING PATTERN IN PRINTED WIRING BOARD

BACKGROUND OF THE INVENTION

1. Field of the Invention

The present invention relates to a method of recognizing a connection of a reconstructing pattern in a printed wiring board, and in particular to a method for recognizing a connection of a reconstructing pattern in a printed wiring board when a circuit modification process after a printed board wiring is performed by a physical cutting, a jumper, and the like.

When a circuit realized on a printed wiring board as pattern-designed by a design supporting device there for and the like is modified, a cutting of a pattern, an addition of a jumper, and a deletion or addition of electric parts are performed to make the printed wiring board correspond to a modified circuit.

Since the works for cutting the pattern and for determining an additional position of the jumper of such a printed wiring board take time and easily cause errors as the circuit becomes complicated and the pattern is highly densified, it is demanded to realize a method of recognizing a connection of a reconstructing pattern in a printed wiring board.

2. Description of the Related Art

FIGS. 27A–27C show examples of circuit information and pattern information used in a conventional method (1) of recognizing a connection of a reconstructing pattern.

FIG. 27A shows circuit information, first edition before modification, in which net Nos.1 and 2 are respectively allotted to groups of lands (A, B, C) and (D, E) as connecting elements.

A design supporting device (not shown) connects lands A, B, C of the net No.1 in the order of the land A, a line L1, a via V1, a line L2, the land B, a line L3, and the land C based on the circuit information, first edition, and performs a pattern design for connecting lands D and E of the net No.2 in the order of the land D, a line L4, a via V2, a line L5, and the land E to output the connections as pattern information, first edition.

The pattern information, first edition is composed of the land (via) information (A, B, C, D, E, V1, V2), the line information (L1–L5), and net information. The net information is composed of the lands, which are the same as the lands of the circuit information, first edition for each of the net Nos.1 and 2, as well as the vias and the lines for connecting the lands, for each of the net Nos.1 and 2.

FIG. 27B shows second circuit information and pattern information when a circuit modification that lands A and B are connected to a land X added instead of the land C in the net No.1. is performed to the circuit connection of FIG. 27A.

Namely, in the circuit information, second edition, the lands of net No.11 corresponding to the net No.1 of the circuit information, first edition is modified to the lands A, B and X, while the lands D and E of net No.12 corresponding to the net No.2 have no modification.

In the pattern information, second edition, the land X is added to the land information, the line information has no modification, the land C and the line L3 are deleted from the connecting elements of the net No.11 in the net information and the land X is added to the same, and the connecting elements of the net No.12 has no modification.

FIG. 27C shows an image of files of the information shown in FIGS. 27A and 27B. Pattern information, first edition file F1 is prepared from circuit information, first edition file F1, and circuit information, second edition file F2 is prepared according to a circuit modification, so that pattern information, second edition file F21 is prepared from the circuit information, second edition file F2.

The pattern information, first edition file F11 is compared with the pattern information, second edition file F21 so that a physically different part is found to perform a pattern reconstruction.

This method has to retain the pattern information corresponding to the circuit information for every circuit modification as a file so that the storage capacity required becomes large.

FIGS. 28A and 28B show examples of the circuit information and the pattern information used in a conventional method (2) of recognizing a connection of a reconstructing pattern. In these examples, the circuit information, first edition file F1, the pattern information, first edition file F11, and the circuit information, second edition file F2 are the same as those shown in FIGS. 27A–27C. However, in the pattern information after the circuit modification, the line L2 which mutually connects the lands B and C is assumed to be not connected to the land B, as shown in FIG. 28B.

Accordingly, although the pattern information, second edition file is not used as modified pattern information to require a smaller storage capacity, the propriety of dummy portions becomes less clear so that the required storage capacity increases as the frequency of the modification increases.

Furthermore, since it is premised in this method that the pattern information has no short circuit and a line element is required to be separated in a psudo form, the best section for separation can not be detected in a loop pattern or a large area pattern.

FIG. 29 shows a data structure example of a pattern link table (hereinafter abbreviated as PTLNK table) 10, a land table (hereinafter abbreviated as LAND table) 20, and a line table (hereinafter abbreviated as LINE table) 30 used by prior art methods (1) and (2) of recognizing a connection of a reconstructing pattern. In this example, the pattern information is composed of the PTLNK table 10, the LAND table 20, and the LINE table 30 in order to recognize the connection of connecting elements such as lands, lines, and the like.

Arrangement elements 11, 12, ... etc. of the PTLNK table 10 corresponds to the net Nos.1, 2, ... etc. shown in FIGS. 27A–27C, wherein the arrangement elements 11, 12, ... etc. are composed of land link pointers (hereinafter abbreviated as LNDLNKP pointer) and line link pointers (hereinafter abbreviated as LINLNKP pointer) which respectively point the land to be connected in the LAND table 20 and the line in the LINE table 30.

The LAND table 20 and the LINE table 30 are respectively composed of the arrangement elements corresponding to the lands and lines which are the connecting elements of the whole circuit. The arrangement elements 21–27, ... etc. of the LAND table 20 are composed of the lands (or vias) A–E, V1, V2, ... etc. and the land link pointers which point the arrangement elements of the lands to be connected to the above-mentioned lands (or vias) A–E, V1, V2, ... etc. These land link pointers will be also hereinafter abbreviated by the same reference character as the LNDLNKP pointer of the PTLNK table. The LINE arrangement elements 31–35, ... etc. of the LINE table 30 are composed of the lines L1, ... L5, etc. and the line link pointers which point the arrangement elements of the lines to be connected to the above-mentioned lines L1, . . . L5, . . . etc. These line link pointers will be also hereinafter abbreviated as LINLNKP pointer in the same manner.

For instance, the LNDLNKP pointer of the arrangement element 11 in the PTLNK table 10 points the arrangement element 21 of the LAND table 20 so that the LNDLNKP pointer of the arrangement element 21 points the arrangement element 22. Hereafter, the arrangement elements 23 and 26 are sequentially pointed in the same manner, so that when the LNDLNKP pointer of the arrangement element 26 is set to "0", the link of the land by the pointer is ended.

In addition, the LINLNKP pointer of the arrangement element 11 in the PTLNK table 10 points the arrangement element 31 in the LINE table 30, the LINLNKP pointer of the arrangement element 31 points the arrangement element 32, and the LINLNKP pointer of the arrangement element 32 points the arrangement element 33, so that when the LINLNKP pointer of the arrangement element 33 is set to "0", the link of the line by the pointer is ended.

Accordingly, all of the lands and lines which the PTLNK arrangement element 11 points are the lands A–C, the via V1, and the lines L1–L3.

Likewise, all of the lands and lines pointed by the LNDLNKP pointer and the LINLNKP pointer of the arrangement element 12 in the PTLNK table 10 are lands D, E, the via V2, and the lines L4, L5.

This means that the lands A–C, the via V1, and the lines L1–L3 have belonged to the net of No.1 corresponding to the PTLNK arrangement element 11 and that the lands D, E, the via V2, and the lines L4, L5 have belonged to the net of No.2 corresponding to the PTLNK arrangement element 11.

FIGS. 30A and 30B show an embodiment of a net and a prior art physical connection table (hereinafter occasionally referred to as PLINK table) 50 for recognizing the physical connection of the net.

FIG. 30A specifically shows an arrangement of the lands A–D, the via V1, and the lines L1–L6 which are the connecting elements of the net No.1 on a pattern wiring board. In FIG. 30A, the land A, the via V1, the lands B, C, and the lines L1, L2, L4 are sequentially connected, so that the land D is further connected to the land B with the line L3 and is connected to the land C with the lines L6 and L5.

FIG. 30B specifically shows the PLINK table 50 having a forward direction connecting direction address (hereinafter referred to as KP address) for recognizing the physical connection of the net of FIG. 30A.

Namely, the lands A–D, the via V1, and the lines L1–L6 which are the connecting elements are respectively set corresponding to the arrangement addresses "1–11", so that KP addresses are respectively set corresponding to the connecting elements.

If the land A for instance is made a reference (a starting point), the KP address of the land A is set to "−1", the KP address of the line L1 connected to the land A is set to "1" which is the arrangement address of the land A, and the KP address of the via V1 connected to the line L1 is set to "6" which is the arrangement address of the line L1.

Hereafter, the KP addresses of the line L2, the land B, the line L4, the land C, and the line L5 are respectively set to "5", "7", "2", "9", and "3", as well as the KP addresses of the line L3, the land D, and the line L6 are respectively set to "2", "8", and "4" in the same manner.

Accordingly, by repeating the search or retrieval of the line L1 having the KP address of the same value as the arrangement address "1" from the reference land A and the search of the via V1 having the same KP address as the arrangement address "6" of the line L1, it becomes possible to sequentially search and recognize the connecting elements physically connected to the land A.

In such a prior art method of recognizing a connection of a reconstructing pattern in a printed wiring board, it can be recognized that e.g. in FIG. 30A the line L5 is connected to the land C since the KP address of the line L5 is "3" and that the line L6 is connected to the land D since the KP address of the line L6 is "4".

However, it can not be recognized that the lines L5 and L6 are connected. This is because the land B, the line L4, the land C, the lines L5 and L6, the land D, and the line L3 form a loop pattern.

When the circuit modification for separating e.g. the land D from the lands A, B, and C is performed, it is found in the PLINK table 50 that the line L3 of the arrangement address "8" can be cut from the KP address "8" of the land D. However, the connection between the land D, the lines L6 and L5, and the land C is not yet recognized.

In order to recognize this connection, it has been required to prepare the PLINK table 50 in which the connection order is change to recognize the connection of the lines L5 and L6.

In the presence of many loop patterns and many connecting elements of this kind, there has been a problem that it takes time to set again or reset the KP addresses by referring to the coordinate.

Also, since a large area pattern has been treated as diagram information so that the cutting of the large area pattern is performed by a diagram operation in the prior art method, there has been a problem that the process speed is delayed as diagram data increase.

SUMMARY OF THE INVENTION

It is accordingly an object of the present invention to provide a method of recognizing a connection of a reconstructing pattern in a printed wiring board performing a circuit modification process after a printed board wiring wherein a required storage capacity is small and the physical connection of connecting elements including a loop pattern and a large area pattern is recognized at a high speed to perform the circuit modification process.

In order to achieve the above-mentioned object, a method of recognizing a connection of a reconstructing pattern in a printed wiring board, according to claim 1, of the present invention comprises the step of; preparing a physical connection table (PLINK table), corresponding to each net, which has a connecting direction address (KP address) indicating a (forward) connection order of connecting elements with a predetermined connecting element being made a starting point and a backward connecting direction address (NKP address) set based on the connecting direction address and indicating a backward connection order to the (forward) connection order and which enables a physical connection of the connecting elements to be recognized, based on a pattern input information table indicating a physical state of the connecting elements.

Namely, the KP addresses indicating the connection order of the connecting elements are set in the PLINK table, with a predetermined connecting element being made a reference element as a starting point, based on the physical state of the connecting elements which the pattern input information table indicates. Furthermore, the NKP addresses indicating the backward connection order to the (forward) connection order of the KP addresses can be set in the PLINK table based on the KP addresses.

As a result, it becomes possible to recognize the physical connecting state of the connecting elements of the net based on the KP addresses and the NKP addresses as set with a less storage capacity and at a high speed.

Also, in the present invention according to claim 2, the connecting direction address and the backward connecting direction address of the physical connection table may be modified to a connecting direction address and a backward connecting direction address corresponding to a modified circuit to recognize the physical connection.

Namely, the physical connection of the connecting elements after the circuit modification can be recognized by preparing the PLINK table in which the KP addresses and the NKP addresses after the modification are set based on the KP addresses and the NKP addresses before the circuit modification.

As a result, it becomes possible to recognize the physical connection of the connecting elements at a high speed and to perform the circuit modification process.

Also, in the present invention according to claim 3, the connecting elements may be composed of a land and a line, and the land may include a via, a manual land, and an external land for parts which are not mounted on the printed wiring board, and the line may include a jumper for mutually connecting the connecting elements on the printed wiring boards, the external land and the connecting elements, and the external lands.

Namely, in addition to the part land, the via, the manual land, and the external land which is not on the wiring board are treated as a land. Also, besides an ordinary line, the jumper connecting the connecting elements on the wiring board, the external lands, as well as the connecting element and the external land are treated as a line. The land and the line can be treated in the unified form as a connecting element.

As a result, it becomes possible to recognize the physical connection between the part land, the via, the manual land, the external land, the line, and the jumper which are all connecting elements at a high speed.

Also, in the present invention according to claim 4, the predetermined connecting element may comprise a land, and the connecting direction address may be set with only a connection order from the starting land set in the physical connection table to a second land being reversed and the second land being made a starting point.

Namely, the KP addresses with the second land being made a reference land are set again or reset with only the connection order from the starting land to the second land being reversed and with the other KP addresses being not modified.

As a result, it becomes possible to obtain (repaint) the KP addresses whose reference land is modified at a high speed.

Also, in the present invention according to claim 5, whether or not a line whose backward connecting direction address indicating that the line is not connected is physically connected to a second connecting element may be determined based on the pattern input information table, and when the line is connected it may be recognized that the net includes a loop pattern.

Namely, the (forward) connecting direction address and the backward connecting direction address indicate only the connection order, so that all of the connecting states of the connecting elements in the net are not indicated. Thus, whether or not the line recognized as being not connected to the other connecting elements is connected in the actual net is determined based on the pattern input information table, so that when the line is connected it is recognized that the net includes the loop pattern.

Accordingly, it becomes possible to determine whether or not the net includes the loop pattern by confirming the connection of only lines recognized as being not connected to the connecting elements. As a result, it becomes possible to recognize the loop pattern at a high speed.

Also, in the present invention according to claim 6, a cutting of the line may be recognized by being regarded as a temporarily cut line, and the jumper may be recognized by being regarded as a line between the elements.

Namely, it is possible to confirm that the circuit modification is accurately performed by regarding the line as being temporarily cut and by regarding the added jumper as a line when the circuit modification is performed. As a result, it becomes possible to perform the circuit modification process at a high speed.

Also, in the present invention according to claim 7, a physical connection table where two nets are connected with the jumper to form a single net may be prepared by combining a physical connection table of two nets and a physical connection table of the jumper, and the connecting direction address and the backward connecting direction address of the combined physical connection table may be set based on the connecting direction address and the backward connecting direction address of original physical connection tables.

Namely, the physical connection table where the physical connection table of two nets and the physical connection table of only the jumper connecting the two nets are combined is prepared so that the combined table is made a physical connection table of a net where the two nets are connected with the jumper.

Then, the connecting direction address and the backward connecting direction address of the physical connection table of the nets connected based on the connecting direction address and the backward connecting direction address of the original connecting table can be set.

As a result, it becomes possible to set the physical connection table of the combined nets at a high speed and to recognize the physical connecting state of the combined connecting elements.

Also, in the present invention according to claim 8, the connecting elements may further include a large area pattern, and the large area pattern may be regarded as being composed of one of a peripheral line of the large area pattern, a punching line of the large area pattern, and an imaginary line connecting the peripheral line and the punching line.

Namely, the large area pattern can not be recognized as diagram information but as only the connecting elements of the peripheral line, the punching line, and the imaginary line connecting the peripheral line and the punching line.

As a result, it becomes possible to treat the large area pattern in the unified form as lines included in the above-mentioned connecting elements and to recognize the physical connection of the connecting elements including the large area pattern at a high speed.

Also, in the present invention according to claim 9, a land directly connected to the large area pattern or included in the large area pattern may be regarded as being directly or indirectly connected to the peripheral line, the punching line, the imaginary line, or a land directly connected to one of these lines with a second imaginary line.

Namely, if the large area pattern is regarded as being the peripheral line, the punching line, and the imaginary line, where these lines will be hereinafter occasionally referred to as a large area connecting pattern, there is a possibility that the land, where this land will be hereinafter occasionally referred to as an inner land of the large area pattern, directly connected to the large area pattern or included in the same assumes the state in which it is not physically connected to the large area connecting pattern.

Thus, the inner land of the large area pattern can be directly connected to the large area connecting pattern with the imaginary line or can be indirectly connected to the large area connecting pattern by connecting the inner lands directly connected with the imaginary line.

As a result, it becomes possible to recognize the physical connection of the connecting elements including the inner land at a high speed.

Also, in the present invention according to claim 10, a cutting of the large area pattern may be recognized by cutting at least one of the peripheral line and the punching line and by adding a second imaginary line.

Namely, when the large area pattern is recognized and cut as the diagram information, it takes time to process the operation. Therefore, the large area pattern cut can be regarded as being composed of the cutting line of at least one of the peripheral line, the punching line, and the imaginary line as well as the second imaginary line added.

As a result, it becomes possible to recognize the physical connection of the connecting elements including the large area pattern cut at a high speed.

Also, in the present invention according to claim 11, a separation of a land directly connected to the large area pattern or included in the large area pattern from the large area pattern may be recognized by cutting at least one of the peripheral line, the punching line, and the second imaginary line.

Namely, the large area pattern and the land directly connected to the large area pattern or included in the same are firstly regarded as the large area connecting pattern. The land can be separated from the large area pattern by cutting the line connected to the land.

As a result, it becomes possible to recognize the separation of the land directly connected to the large area pattern or included in the same at a high speed.

Also, in the present invention according to claim 12, a cutting of the land may be recognized by cutting a peripheral line of the land and by adding an imaginary line.

Namely, in the same way as the large area pattern, the cutting of the land requires the recognition of the land as the diagram information. Accordingly, it takes time to process the operation.

The cut land is regarded as being composed of the peripheral line whose land is cut and the added imaginary line.

As a result, it becomes possible to recognize the physical connection of the connecting elements including the cut land at a high speed.

Also, in the present invention according to claim 13, a line cut by a circuit modification may be provided with a priority order of a cutting.

Namely, when the connecting elements including the large area pattern processed as the diagram information is physically cut, the priority order of the cutting position can not be considered since the recognition of the large area pattern has a priority.

Therefore, the large area pattern is regarded as a large area connecting pattern (aggregation of lines). As a result, it becomes possible to decide the priority order of the cutting of the lines including the large area connecting pattern and to designate an adequate cutting line.

Also, in the present invention according to claim 14, the net may include the attribute of a signal pattern of an MST wiring, a single stroke drawing-wiring, or a single stroke drawing-wiring for designating a connection order, or of a large area connecting pattern including a loop pattern, and when the attribute is the large area connecting pattern the connection order of the connecting elements may be determined by using a connecting element-unique decision method.

Namely, the net is classified into one of the signal patterns of the MST wiring, the single stroke drawing-wiring or a single stroke drawing-wiring for designating the connection order, and of the large area connecting pattern including the loop pattern. When the net is the large area connecting pattern, the connection order of the net is determined by the connecting element-unique decision method to set the KP addresses and the NKP addresses.

As a result, it becomes possible to recognize the physical connection of the large area connecting pattern including the loop pattern at a high speed.

BRIEF DESCRIPTION OF THE DRAWINGS

FIGS. 15A–15D are diagrams showing examples connecting a plurality of nets in a method of recognizing a connection of a reconstructing pattern in a printed wiring board according to the present invention;

FIG. 25 is a diagram showing an example of a PLINK table in which a connecting element-unique decision method is applied to a large area connecting pattern in a method of recognizing a connection of a reconstructing pattern in a printed wiring board according to the present invention;

Throughout the figures, like reference numerals indicate like or corresponding components.

DESCRIPTION OF THE EMBODIMENTS

Figure 1:
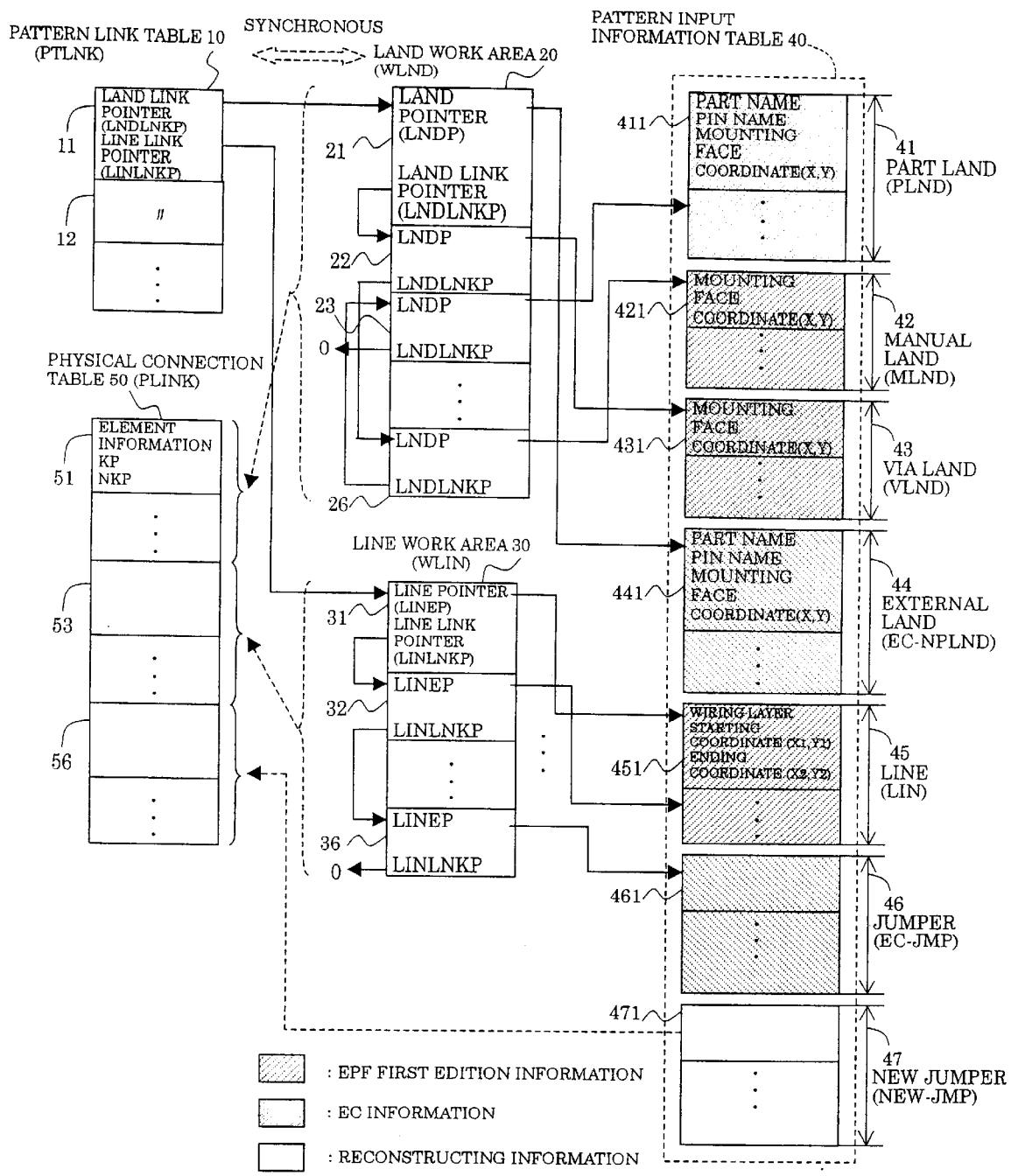
FIG. 1 is a block diagram showing a data structure example (1) in a method of recognizing a connection of a reconstructing pattern in a printed wiring board according to the present invention.

FIG. 1 shows an embodiment of a data structure used in a method of recognizing a connection of a reconstructing pattern in a printed wiring board according to the present invention.

In this embodiment, the data structure is composed of a PTLNK table 10, a land work area (hereinafter referred to as WLND table) 20, a line work area (hereinafter referred to as WLIN table) 30, a pattern input information table 40, and a PLINK table 50.

Figure 29:
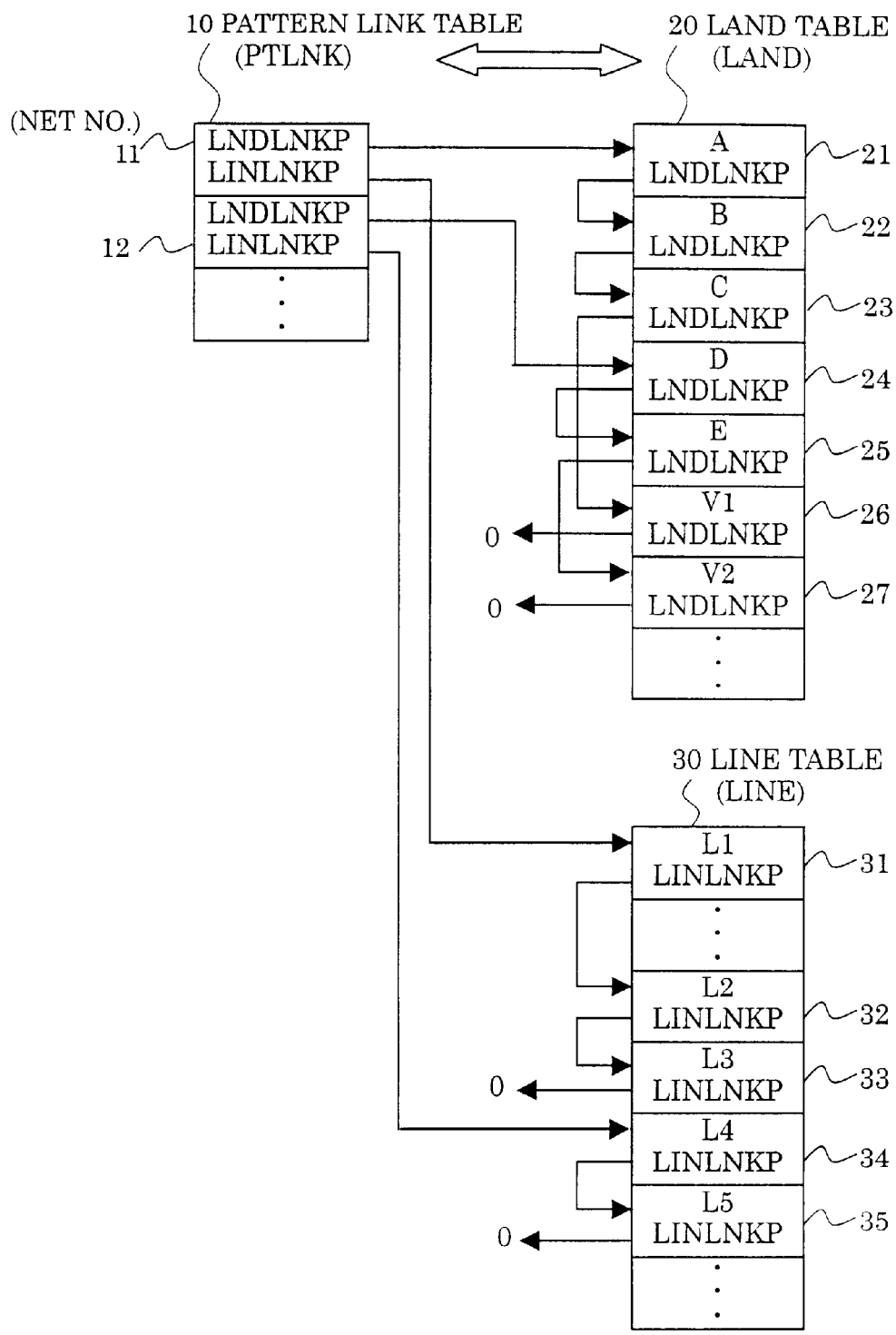
FIG. 29 is a block diagram showing a data structure example in a conventional method of recognizing a connection of a reconstructing pattern in a printed wiring board.
Figures 30A, 30B:
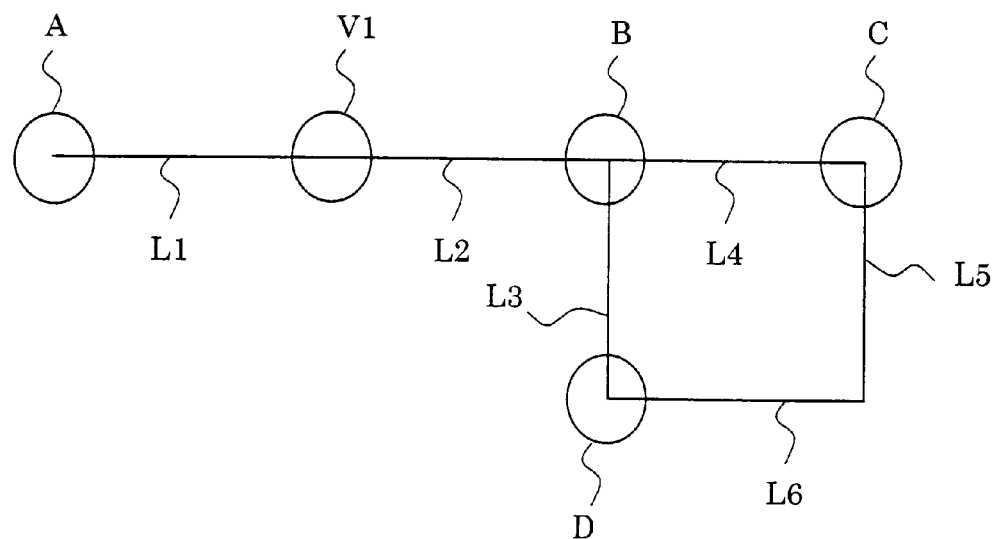
FIGS. 30A and 30B are diagrams showing examples of a PLINK table in a conventional method of recognizing a connection of a reconstructing pattern in a printed wiring board.

The basic arrangements of the PTLNK table 10, the WLND table 20, and the WLIN table 30 are the same as those of the PTLNK table 10, the LAND table 20, and the LINE table 30 described referring to FIG. 29.

The arrangement elements 11, 12, . . . etc. of the PTLNK table 10 correspond to each net so that lands and lines as connecting elements which belong to each net are sequentially designated by LNDLNKP pointers and LINLNKP pointers included in the PTLNK arrangement elements 11, 12, . . . etc., the arrangement elements 21–26 of the WLND table 20, and the arrangement elements 31–36 of the WLIN table 30.

The pattern input information table 40 includes a part land (hereinafter referred to as PLND land) 41 composed of land elements 411, . . . etc., a manual land (hereinafter referred to as MLND land) 42 composed of land elements 421, . . . etc., a via (hereinafter referred to as VLND land) 43 composed of land elements 431, . . . etc., and an external land (hereinafter referred to as EC-NPLND land) 44 composed of land elements 441, . . . etc.

The table 40 further includes a line (hereinafter referred to as LIN line) 45 composed of line elements 451, . . . etc., a jumper (hereinafter referred to as EC-JMP jumper) 46 composed of line elements 461, etc., and a new jumper (hereinafter referred to as NEW-JMP jumper) 47 composed of line elements 471, . . . etc.

The arrangement elements 21–26 of the WLND table 20 further include land pointers (hereinafter referred to as LNDP pointer). Each of the LNDP pointers points one of the land elements 411 . . . etc., 421 . . . etc., 431 . . . etc., 441 . . . etc.

Likewise, the arrangement elements 31–36 of the WLIN table 30 include line pointers (hereinafter referred to as LINEP pointer). Each of the LINEP pointers points one of the line elements 451, etc., 461, ... etc.

The pattern input information table 40 includes physical information of the PLAND land 41, the MLND land 42, the VLND land 43, the EC-NPLND 44, the LIN line 45, the EC-JMP jumper 46, and the NEW-JMP jumper 47 which are all the connecting elements.

The PLAND land 41, the MLND land 42, the VLND land 43, and the LIN line 45 form EPF first edition information, the EC-NPLND land 44 and the EC-JMP jumper 46 form EC information (see the hatched portions illustrated in FIG. 1), and the NEW-JMP jumper 47 forms reconstructing information.

The information of the PLND land 41 and the EC-NPLND land 44 is composed of a part name, a pin name, a mounting face, a coordinate (X, Y) of the land corresponding to the pin and the like, the information of the MLND land 42, and the VLND land 43 is composed of a mounting face, a coordinate (X, Y) and the like, and the information of the LIN line 45, the EC-JMP jumper 46, and the NEWJMP jumper 47 is composed of a wiring layer, a starting coordinate (X1, Y1) and an ending coordinate (X2, Y2).

It is to be noted that predetermined data are set in the mounting face or the wiring layer and the coordinate of the EC-NPLND land 44, the EC-JMP jumper 46, and the NEW-JMP jumper 47, so that the data enable the EC-NPLND land 44, the EC-JMP jumper 46, and the NEW-JMP jumper 47 to correspond to external parts and the jumper added in accordance with a circuit modification.

The PLINK table 50 is prepared for each of the arrangement elements 11, 12, ... etc. of the PTLNK table 10. For instance, all of the lands and lines which the LNDLNKP pointer and the LINLNKP pointer of the PTLNK arrangement element 11 respectively designate are sequentially set as element information in PLINK elements 51–56 of the PLINK table 50 corresponding to the PTLNK arrangement element 11. Furthermore, KP addresses and NKP addresses are set in the PLINK elements 51–56 so that the physical connection of the connecting elements set in the PLNK table 50 can be recognized.

Figure 2:
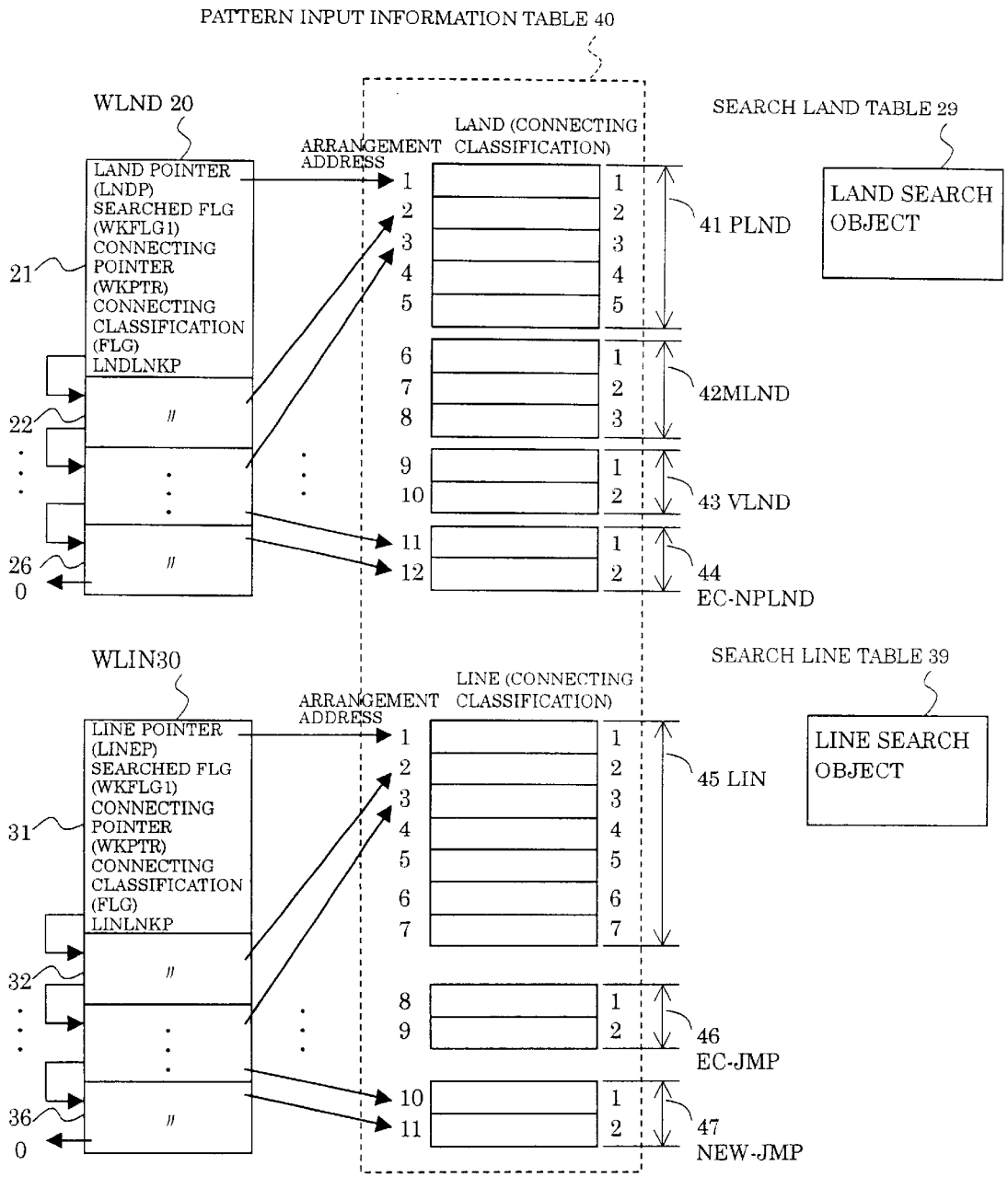
FIG. 2 is a block diagram showing a data structure example (2) in a method of recognizing a connection of a reconstructing pattern in a printed wiring board according to the present invention.

FIG. 2 shows in more detail the WLND table 20, the WLIN table 30, and the pattern input information table 40 shown in FIG. 1.

Namely, the arrangement elements 21–26 of the WLND table 20 further include a searched flag (hereinafter referred to as WKFLG1 flag), a connecting pointer (hereinafter referred to as WKPTR pointer), and a connecting classification (hereinafter referred to as FLG flag) in addition to the LNDP pointer and the LNDLNKP pointer shown in FIG. 1, while the arrangement elements 31–36 of the WLIN table 30 include the WKFLG1 flag, the WKPTR pointer, and the FLG flag in the same way as the WLND table 20.

The pattern input information table 40 is composed of a land information table and a line information table.

The land information table is composed of the PLND land 41 consisting of the arrangement elements of the arrangement addresses "1–5", the MLND land 42 consisting of the arrangement elements of the arrangement addresses "1–3", the VLND land 43 consisting of the arrangement elements of the arrangement addresses "1" and "2", and the EC-NPLND land 44 consisting of the arrangement elements of the arrangement addresses "1" and "2", so that a series of arrangement addresses "1–12" are allotted to the arrangement elements of the whole lands.

In the land information table, the part land, the manual land, the via, and the external land are treated as the same land by a series of arrangement addresses. Hereinafter, the external land, the manual land, and the via will be occasionally referred to simply as land.

The line information table is composed of the LIN line 45 consisting of the arrangement elements of the arrangement addresses "1–7", the EC-JMP jumper 46 consisting of the arrangement elements of the arrangement addresses "1" and "2", and the NEW-JMP jumper 47 consisting of the arrangement elements of the arrangement addresses "1" and "2", so that a series of arrangement addresses "1–11" are allotted to the arrangement elements of the whole lines. In the line information table, the LIN line 45, the EC-JMP jumper 46, and the NEW-JMP jumper 47 are to be treated as the same line by a series of arrangement addresses.

The LNDP pointer and the LINEP pointer of the WLND table 20 and the WLIN table 30 respectively point the land and the line of the pattern input information table 40 by a series of arrangement addresses.

In addition, a search land table (hereinafter referred to as SRCHLND table) 29 and a search line table (hereinafter referred to as SRCHLIN table) 39 are respectively attached to the land information table and the line information table.

Figures 3A, 3B, 3C:
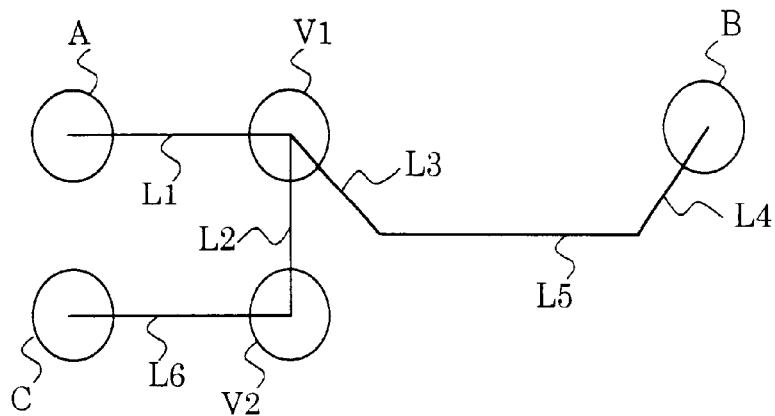
FIGS. 3A–3C are diagrams showing setting examples of a WLND table and a WLIN table according to the present invention.

FIGS. 3A–3C show embodiments of the WLND table 20 and the WLIN table 30 shown in FIG. 2. Particularly, FIG. 3A shows a connecting state of lands A, B, C, V1, V2, and lines L1–L6 which are the connecting elements of the net of e.g. No.11 shown in FIG. 1.

FIGS. 3B and 3C respectively show the WLND table 20 and the WLIN table 30, in which the arrangement elements are composed of the connecting elements, the WKPTR pointer, the FLG flag, the WKFLG1 flag, the LNDP pointer or the LINEP pointer, and the LNDLINKP pointer or the LINLNKP pointer shown in FIG. 2.

However, the WKFLG1 flag, the LNDP pointer, the LINEP pointer, the LNDLNKP pointer and the LINLNKP pointer are not shown for convenience sake of illustration.

The connecting elements of the WLND table 20 can include the part land, the via, the manual land, and the external land which are lands as the connecting classification. The connecting elements of the WLIN table 30 can include the line and the jumper as the connecting classification.

The arrangement address and the connecting classification of the connecting element to be connected are set in the WKPTR pointer and the FLG flag of each arrangement element.

It is to be noted that the FLG flag is set to "1" when the connecting classification indicates a land while it is set to "2" when the connecting classification indicates a line.

In this embodiment, are shown only the arrangement elements of the arrangement addresses "1–5" and "1–6" of the lands A, B, C, V1, V2 and the lines L1–L6 which belong to the net No.12 for instance, as shown in FIG. 1 linked by the LNDLNKP pointer and the LINLNKP pointer.

Figure 4:
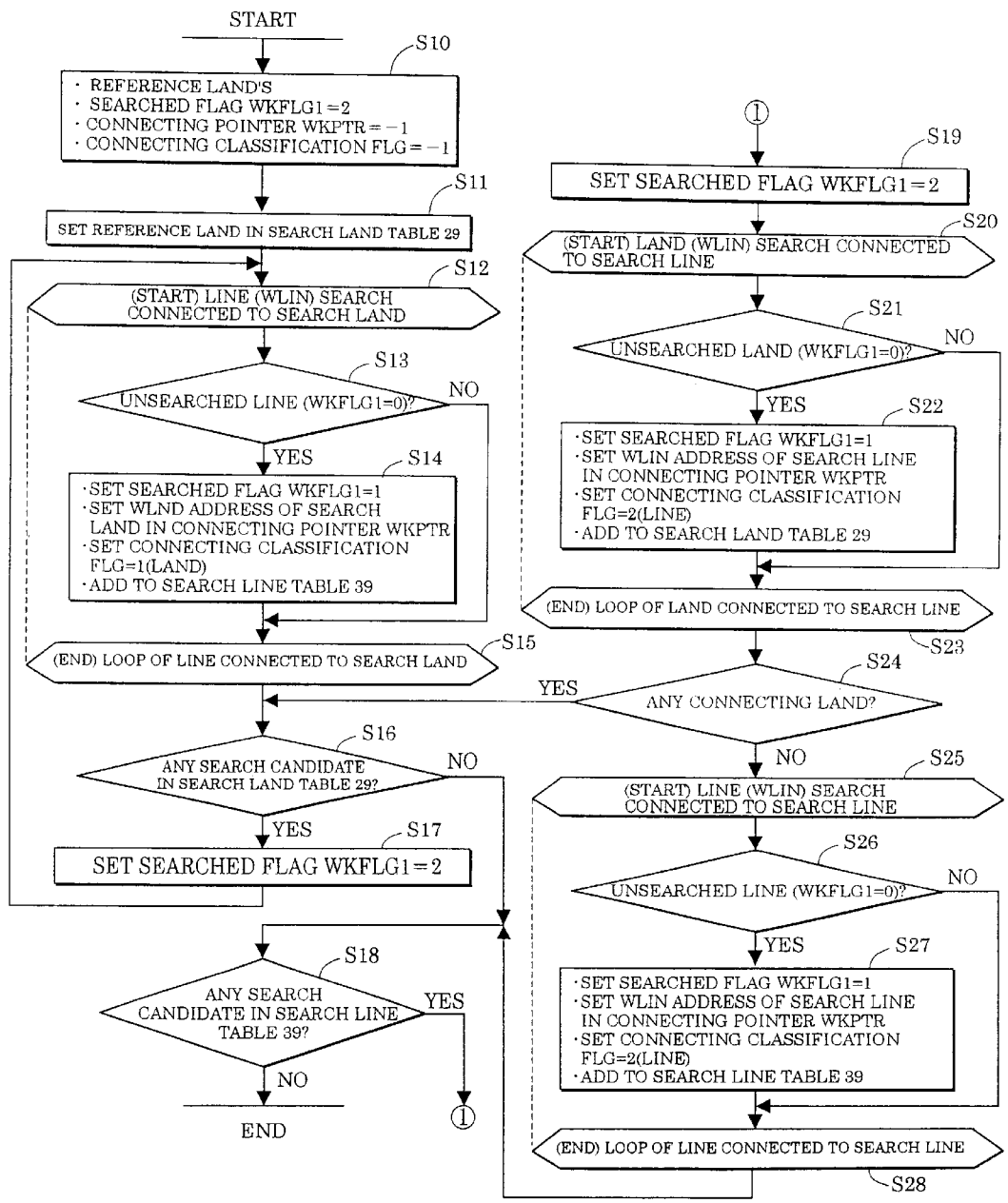
FIG. 4 is a flow chart showing an example of a setting procedure of a WLND table and a WLIN table according to the present invention.

FIG. 4 shows an embodiment of the procedure for setting the WLND table 20 as well as the WKPTR pointer and the FLG flag of the WLIN table 30.

This embodiment schematically shows steps S10 and S11 for setting a reference land as a starting point for recognizing (following) the physical connecting state of the net. Steps S12–S15 describe searching a line connected to a land, steps S20–S23 searching a land connected to a line, and steps S25–S28 searching a line connected to a line.

By properly selecting steps S16, S18, and S24, the line and the land physically connected with the reference land being made a starting point are sequentially recognized.

It is to be noted that the WKPTR pointer="−1" means "no connection", the WKPTR pointer="integer 1 and more" means "the arrangement address of the connecting element", the WKFLG1 flag="0" means "unsearched", the WKFLG1 flag="1" means "candidate for search (retrieval) object", the WKFLG1 flag="2" means "searched", the FLG flag="−1" means "unset", the FLG flag="1" means "connecting element being a land", and the FLG flag="2" means "connecting element being a line".

Hereinafter, a setting example of the WKPTR pointer and the FLG flag of the WLND table 20 and the WLIN table 30 corresponding to the net in FIG. 3A will be described in detail referring to FIG. 4 with the land A being made a reference land.

All of the WKFLG1 flags are firstly set to "0" meaning "unset" as an initial state. The WKPTR pointer of the reference land A of the arrangement address "1" in the WLND table 20 is set to "−1" meaning "reference" and "no connection", the FLG flag is set to "−1" meaning "unset", and the WKFLG1 flag is set to "2" meaning "searched" (at step S10 in FIG. 4).

The reference land A is set in the SRCHLND table 29 (see FIG. 2) as the land search object (at step S11) whereby the search of the line connected to a search land A is started (at step S12).

Whether or not the WKFLG1 flag of the line L1 of the arrangement address "1" in the WLIN table 30 is "0" is checked (at step S13). Since it is initially "0", the starting coordinate (X1, Y1), the ending coordinate (X2, Y2), and the wiring layer are obtained from the arrangement elements of the line L1 in the pattern input information table 40 pointed by the LNDP pointer (see FIGS. 1 and 2).

Furthermore, the coordinate (X, Y) and the mounting face are obtained from the arrangement elements of the land A in the pattern input information table 40 pointed by the LNDP pointer of the land A which is a land search object. It is checked which of the wiring layer and the starting coordinate or the ending coordinate of the line L1 coincides with the mounting face and the coordinate of the land A. As a result, it is determined that the mounting face and the coordinate of the land A are equal to the wiring layer and the starting coordinate of the line L1 so that it is recognized that the line L1 is physically connected to the land A.

The WKFLG1 flag of the line L1 is set to "1" meaning the candidate for the search object, the line L1 is registered in the SRCHLIN table 39, the WKPTR pointer is set to "1" indicating the arrangement address of the land A, and the FLG flag is set to "1" indicating a land (at step S14).

Hereafter, whether or not the lines L2–L6 are physically connected to the land A is sequentially searched in the same manner. After it is recognized that no line is connected to the land A, the land A as a search candidate in the SRCHLND table 29 is deleted so that the WKFLG1 flag is set to "2". The search loop of the line connected to the search land extending over steps S12–S15 is ended (at step S15).

Since there is no land of the search candidate in the SRCHLND table 29 (at step S16), whether or not there is a search candidate in the SRCHILIN table 39 is determined, with the result that it is found that the line L1 is the search candidate (at step S18). Therefore, the WKFLG1 flag of the line L1 is set to "2" (at step S19) to start the search loop of the land connected to the search line L1 (at step S20).

The WKFLG flags of the lands A, B, C, V1, and V2 in the WLND table 20 are sequentially checked. The mounting faces and the coordinates of the lands B. C, V1, and V2 are then recognized from the LNDP pointers of the lands B, C, V1, and V2 whose WKFLG1 flags are "0" meaning "unsearched". Whether or not the coordinates coincide with the ending coordinate (X2, Y2) and the wiring layer of the line L1 is searched to recognize that the land V1 coincides with them.

The land V1 is registered in the SRCHLND table 29, the WKFLG1 flag is set to "1", the WKPTR pointer is set to "1" which is the arrangement address of the line L1, and the FLG flag is set to "2" meaning a line (at step S22). The search loop of the land connected to the search line L1 is ended (at step S23).

Since the WKFLG1 flag of the land V1 in the WLND table 20 is set to "1" at step S24, the process proceeds to step S16, at which since there is found a land VA which is a search candidate in the SRCHLND table 29 (at step S16) the WKFLG1 flag is preset to "2" (at step S17).

Steps S12–

Steps S12–S15 for the line search loop connected to the search land are executed. As a result, the WKPTR pointers and the FLG flags of the lines L2 and L3 are respectively set to "4" indicating the arrangement address of the land V1 and to "1" indicating a land, and the lines L2 and L3 are registered in the SRCHLIN table 39.

Then, the process proceeds to step S24 through steps S16, S18–S23, at which since there is found no connecting land (at step S24) the line search connected to the search line is started (at step S25).

The line L5 connected to the line L3 is detected by the loop, at which the WKPTR pointer and the FLG flag are respectively set to "3" indicating the arrangement address of the line L3 and to "2" indicating a line.

In the same manner, the WKPTR pointer, the FLG flag, and the like of the line L4, the land B, the line L2, the land V2, the line L6, and the land C are set.

When no search candidate remains in the SRCHLND table 29 and the SRCHLIN table 39, the process is ended (at steps S16 and S18).

It is to be noted that by changing a part of the flow of this procedure, the connection order of the connecting elements can be realized by either an undulant type-connecting element recognition method or a connecting element-unique decision method described later.

Figure 5:
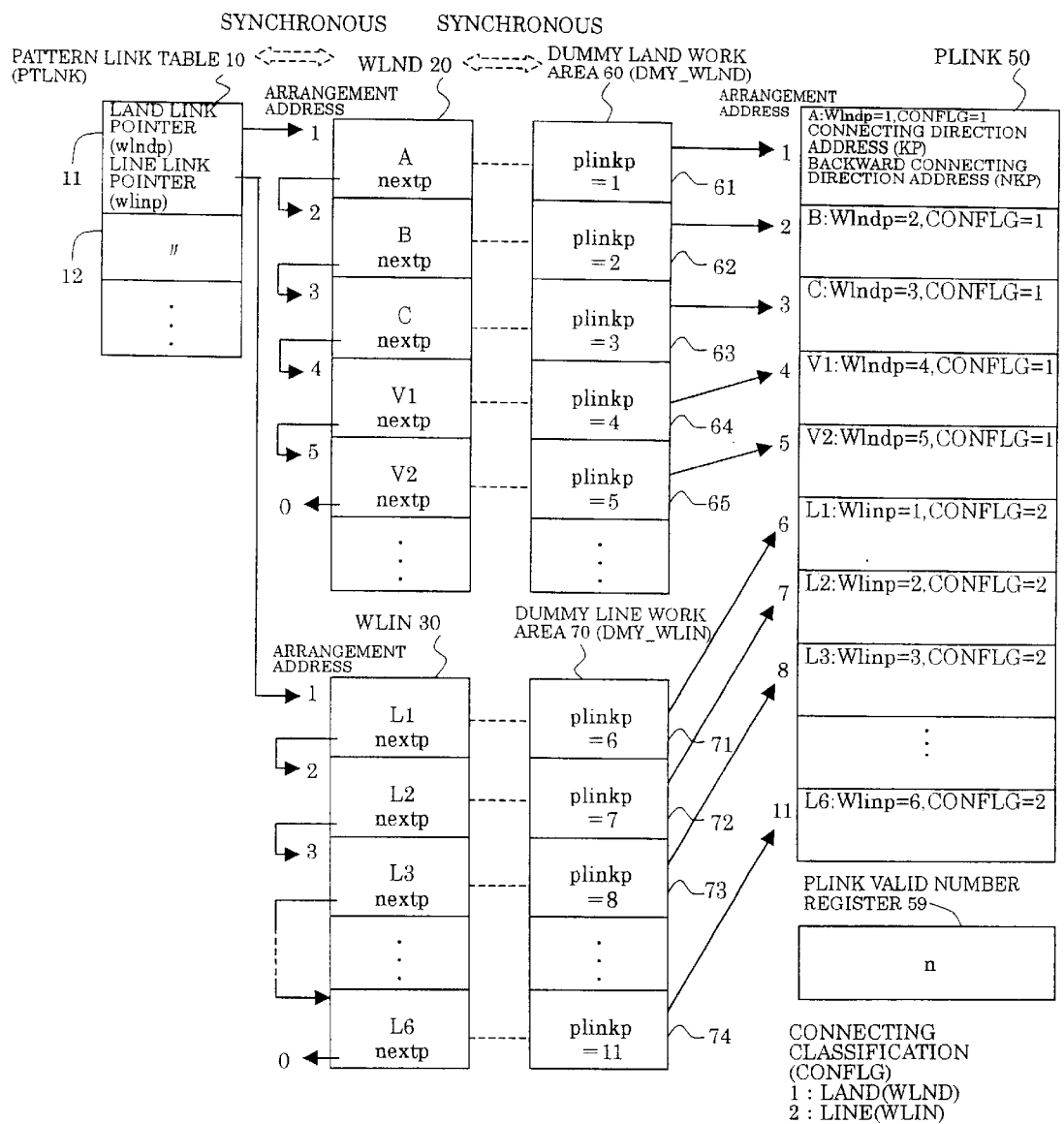
FIG. 5 is a block diagram showing a data structure example (3) in a method of recognizing a connection of a reconstructing pattern in a printed wiring board according to the present invention.

FIG. 5 shows in more detail a link relationship between the PTLNK table 10, the WLND table 20, the WLIN table 30, and the PLINK table 50 shown in FIG. 1 and the data structure thereof.

This data structure example schematically illustrates a dummy land work area (hereinafter referred to as DMY_WLND table) 60 and a dummy line work area (hereinafter referred to as DMY_WLIN table) 70, which are further secured between the WLND table 20, the WLIN table 30, and the PLINK table 50 in order to recognize the physical connecting states of the connecting elements at a high speed.

Furthermore, the area or region for storing the valid number of the elements in the PLINK table 50 is secured as a PLINK valid number register 59.

In addition, the LNDLNKP pointer and the LINLNKP pointer in FIG. 1 are respectively referred to as a wlndp pointer and wlinp pointer in the PTLNK table 10 in FIG. 5 and are referred to as a next pointer in the WLND table 20 and the WLIN table 30.

In the same way as FIG. 1, the link of the next pointer with the wlndp pointer and the wlinp pointer of the PTLNK arrangement element 11 being made a starting point indicates that the lands A, B, C, V1, and V2 of the arrangement addresses "1–3" in the WLND table 20 and the lines L1–L6 of the arrangement addresses "1–3" in the WLIN table 30 belong to the net of No.11.

When the circuit modification occurs in the net No.11, the DMY_WLND table 60 and the DMY_WLIN table 70 are set respectively having DMY_WLND arrangement elements 61–65 and DMY_WLIN arrangement elements 71–74 respectively corresponding to (in synchronization with) the lands A, B, C, V1, V2 and the lines L1–L6 one by one. Furthermore, the arrangement addresses "1–11" of the lands A, B, C, V1, V2, and the lines L1–L6 in the latest PLINK table 50 are set in the plink pointers of the arrangement elements 61–65 and the arrangement elements 71–74.

Figure 6A:
FIGS. 6A and 6B are diagrams showing setting examples of KP addresses of a PLINK table in a method of recognizing a connection of a reconstructing pattern in a printed wiring board according to the present invention.
Figure 6B:

FIGS. 6A and 6B show embodiments of the PLINK table 50 shown in FIG. 5. In this example, tables corresponding to the net of FIG. 3A are shown.

The PLINK table 50 is different from the WLND table 20 and the WLIN table 30 respectively shown in FIGS. 3B and 3C in that a series of arrangement addresses (arrangement numbers) are provided to the lands and the lines to be processed.

Particularly, FIG. 6A shows an example when the land A is set as the reference land which is assumed to be a starting point of the connection, in which the KP address of the land A is set to "–1" indicating the reference land. The arrangement address "1" of the land A is set in the KP address of the line L1 connected to the land A (see FIG. 3A) and the arrangement address "6" of the line L1, is set in the KP address of the land V1 connected to the line L1.

Both in the KP addresses of the lines L2 and L3 connected to the land V1, "4" is set. Likewise, the KP addresses of other lands and lines are determined.

In the PLINK table 50 in FIG. 6B, the KP addresses are set when the land B is set as the reference land. FIG. 6A being compared with FIG. 6B, it is found that the KP addresses vary by changing the reference land.

Figure 7:
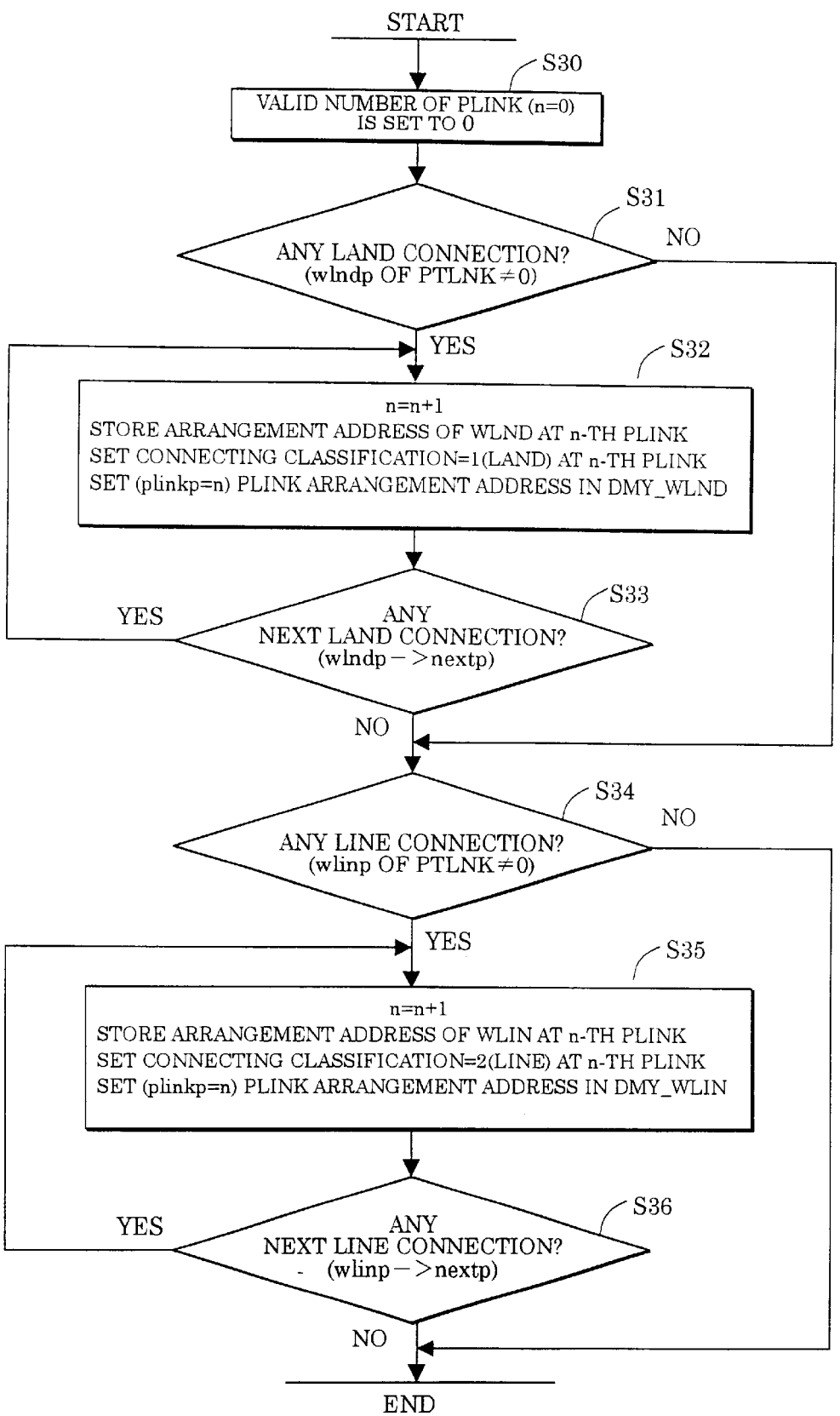
FIG. 7 is a flow chart showing an example of a setting procedure of a PLINK table using a DMY_WLND table and a DMY_WLIN table in a method of recognizing a connection of a reconstructing pattern in a printed wiring board according to the present invention.

FIG. 7 shows an embodiment for securing the arrangement elements and for setting the procedures of the DMY_WLND table 60, the DMY_WLIN table 70, and the PLINK table 50 corresponding to the WLND table 20 and the WLIN table 30 shown in FIG. 5.

This embodiment schematically illustrates the corresponding relationship between the arrangement elements of the WLND table 20 and the WLIN table 30 and those of the PLINK table 50, which is adapted to be indicated by a CONFLG flag, the Wlndp pointer, and the Wlinp pointer included in the arrangement elements of the PLINK table 50. Also, the corresponding relationship between the arrangement elements of the DMY_WLND table 60 and the DMY_WLIN table 70 and those of the PLINK table 50 is adapted to be indicated by plinkp pointers included in the arrangement elements of the tables 60 and 70.

At step S30, the PLINK valid number register 59 for setting the arrangement element number of the PLINK table 50 is set to "0". The arrangement elements of the PLINK table 50 and the DMY_WLND table 60 corresponding to the WLND table 20 are secured at steps S31–S33, and then are made to mutually correspond by the pointers, so that every time the arrangement element is secured the PLINK valid number register 59 is incremented by "1". The arrangement elements of the PLINK table 50 and the DMY_WLIN table 70 corresponding to the WLIN table 30 are secured at steps S34–S36, and then are made to mutually correspond by the pointers, so that the PLINK valid number register 59 is incremented by "1" to store the arrangement element number.

Hereinafter, the procedure of FIG. 7 will be described in detail referring to FIG. 5.

At step S30, a valid number "n" of the PLINK valid number register 59 is initially set to "0".

Since the wlndp pointer of the PTLNK table 10 is not "0" and there is a connection to the land A (at step S31), "1" is added to "n" to be n=1, the arrangement address "1" of the WLND table 20 pointed by the wlndp pointer is set in the Wlndp pointer of the first arrangement element of the PLINK table 50, and "1" meaning a land is set in the CONFLG flag. The first arrangement address "1" of the PLINKP table 50 is set in the plinkp pointer of the first arrangement element of the DMY_WLND table 60 (at step S32).

Since the nextp pointer of the arrangement address "1" in the WLND table 20 points the land B (at step S33), the process returns to step S32, at which "1" is added to "n" to be n=2, the arrangement address "2" of the land B in the WLND table 20 is set in the Wlndp pointer of the second arrangement element in the PLINK table 50, and "1" is set in the CONFLG flag. In the plinkp pointer of the second arrangement element in the DMY_WLND table 60, "2" is set (at step S32).

Likewise, with respect to the pointed lands C, V1, and V2, "1" is added to "n" three times to be n=5, "3", "4", and "5" are respectively set in the 3rd-5th Wlndp pointers of the PLINK table 50, and "1" is set in all of the CONFLG flags, so that "3–5" are set in the 3rd–5th plinkp pointers in the DMY_WLND table 60 (at step S32).

Since the nextp pointer of the land V2 is "0" (at step S33), the process proceeds to step S34, at which the lines L1–L6 are sequentially pointed by the nextp pointer with the wlinp pointer of the PTLNK table 10 being made a starting point. Then, steps S35 and S36 are repeated in the same way as steps S32 and S33, and "1–6" are respectively set in the Wlinp pointers of the arrangement addresses "6–11" in the PLINK table 50, so that "2" meaning a line is set in the CONFLG flag of the arrangement addresses "6–11". "6–11" are respectively set in the plinkp pointers corresponding to the lines L1–L6 in the DMY_WLIN table 70. In the PLINK valid number register 59, "11" is to be set as "n".

The loop of steps S35 and S36 is ended when the nextp pointer of the line L6 is "0" (at step S36).

As a result, the areas of the PLINK table 50, the DMY_WLND table 60, and the DMY_WLIN table 70 are secured, and then are made to correspond between the arrangement elements of the tables as well as between the arrangement elements of the PLINK table 50, the WLND table 20, and the WLIN table 30.

It is to be noted that the arrangements of the WLND table 20 and the WLIN table 30 are synchronized with the DMY_WLND table 60 and the DMY_WLIN table 70. Namely, the same land is set in the n-th arrangement element of the WLND table 20 and the DMY_WLND table 60.

The same applies to the lines in the WLIN table 30 and the DMY_WLIN table 70.

Figure 8:
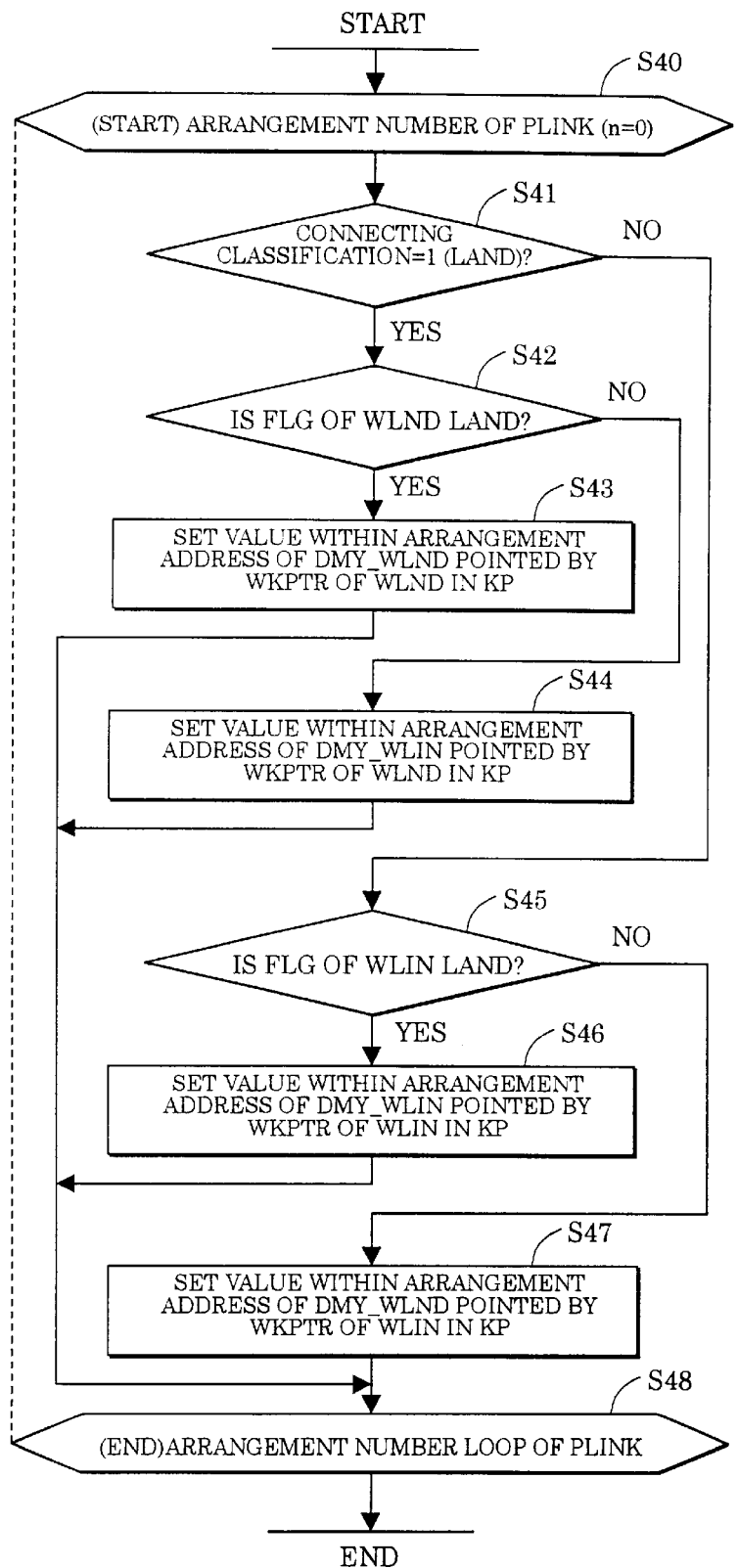
FIG. 8 is a flow chart showing an example of a setting procedure of KP addresses in a PLINK table in a method of recognizing a connection of a reconstructing pattern in a printed wiring board according to the present invention.

FIG. 8 shows an embodiment of a procedure for setting the KP addresses of the PLINK table 50 shown in FIG. 5. In this embodiment, the KP addresses are schematically set in the PLINK table 50 based on the WKPTR pointer and the FLG flag set in the WLND table 20 and the WLIN table 30 in the embodiment of FIG. 4.

Hereinafter, the procedure for setting the KP addresses of the PLINK table 50 shown in FIG. 6A from the WKPTR pointer and the FLG flag set in the WLND table 20 and the WLIN table 30 shown in FIGS. 3B and 3C will be described.

In this procedure, steps S40 to S48 are repeated "n" times (n=the arrangement element number of the PLINK table 50) stored in the PLINK valid number register 59 (see FIGS. 5 and 7).

Firstly, the CONFLG flag indicating the connection classification of the arrangement address "1" in the PLINK table 50 is "1" indicating a land (at step S41 in FIG. 8), so that the FLG flag of the arrangement of the arrangement address "1" in the WLND table 20 which the Wlndp pointer "1" points is referred to (at step S42). Since the FLG flag is "−1" indicating neither a land nor a line, the KP address of the arrangement address "1" in the PLINK table 50 is set to "1", which is not shown.

The CONFLG flag indicating the connecting classification of the arrangement address "2" in the PLINK table 50 is "1" indicating a land (at step S41), so that the FLG flag of the arrangement of the arrangement address "2" in the WLND table 20 which the Wlndp pointer "2" points is referred to (at step S42). Since the FLG flag indicates a line, the arrangement address "9" pointed by the plinkp pointer of the arrangement element in the DMY_WLIN table 70 in synchronization with the arrangement address "4" pointed by the WKPTR pointer is made the KP address of the arrangement address "2" in the PLINK table 50 (at step S43).

Hereafter, "II", "6", and "7" are respectively set in the KP addresses of the arrangement addresses "3–5" in the PLINK table 50 in the same manner.

The CONFLG flag indicating the connecting classification of the arrangement address "6" in the PLINK table 50 is "2" indicating a line (at step S41), so that the FLG flag of the arrangement element of the arrangement address "1" in the WLIN table 30 which the Wlinp pointer "1" points is referred to (at step S45). Since the FLG flag "1" indicates a land, the arrangement address "1" pointed by the plinkp pointer of the arrangement element in the DMY_WLND table 60 in synchronization with the arrangement address pointed by the WKPTR pointer is made the KP address of the arrangement address "6" in the PLINK table 50 (at step S46).

Hereafter, "4", "4", and "5" are respectively set in the KP addresses of the arrangement addresses "7", "8", and "11" in the PLINK table 50 in the same manner. With respect to the KP addresses of the arrangement addresses "9" and "10", steps S41, S45, and S47 are executed, so that "10" and "8" are respectively set in their KP addresses.

Figures 9A, 9B:
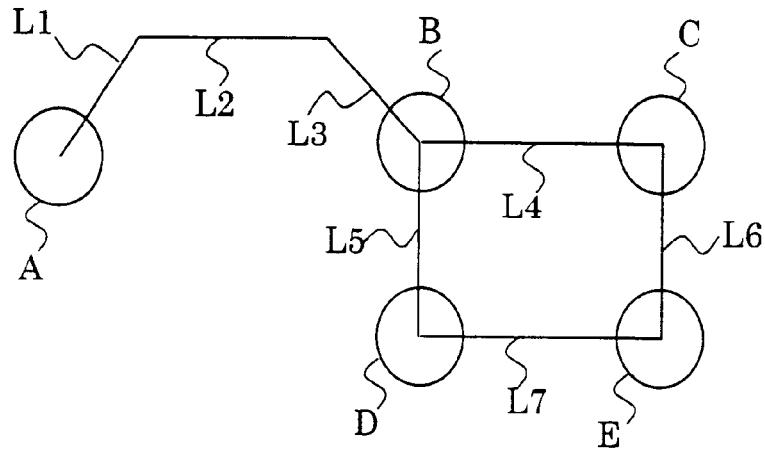
FIGS. 9A and 9B are diagrams showing setting examples of KP addresses and NKP addresses of a PLINK table in a method of recognizing a connection of a reconstructing pattern in a printed wiring board according to the present invention.

FIGS. 9A and 9B show embodiments of the PLINK table 50 shown in FIG. 5. In this example, the KP addresses and the above-mentioned NKP addresses corresponding to the net of FIG. 9A are set in the PLINK table 50 in FIG. 9B.

The description of the KP addresses in FIG. 9B is omitted since they are set by the procedure shown in FIGS. 7 and 8. It is to be noted that the connection of the connecting elements is recognized has the order of the reference land A, the lines L1–L3, the land B, the line L4, the land C, the line L6, and the land E, as well as the line L5, the land D, and the line L7 branched from the land B.

Hereinafter, the setting of the NKP addresses will be described.

According to the present invention, the NKP addresses are set in the same order as the order of recognizing the connection in which the KP addresses are set. Namely, the NKP addresses are to be set corresponding to the KP addresses.

The NKP address of the land A of the arrangement address "1" is set to the arrangement address "6" of the line L1 since the land A is connected to the line L1. The NKP address of the line L1 is set to the arrangement address "7" of the line L2 since the line L1 is connected to the line L2.

Hereafter in the same manner, the NKP addresses of the line L3, the land B, the line L4, the land C, the line L6, and the land E are set to "2", "9", "3", "11", "5", and "−", while the NKP addresses of the land B, the line L5, the land D, and the line L7 as branched are set to "10", "4", "12", and "−".

Since the NKP addresses of the land E and line L7 have no element connected in the backward direction, the above symbol "−" is set in their NKP addresses, while since the NKP address of the land B has the lines L4 and L5 as the backward connecting elements two addresses are set in the NKP address of the land B.

Figure 10:
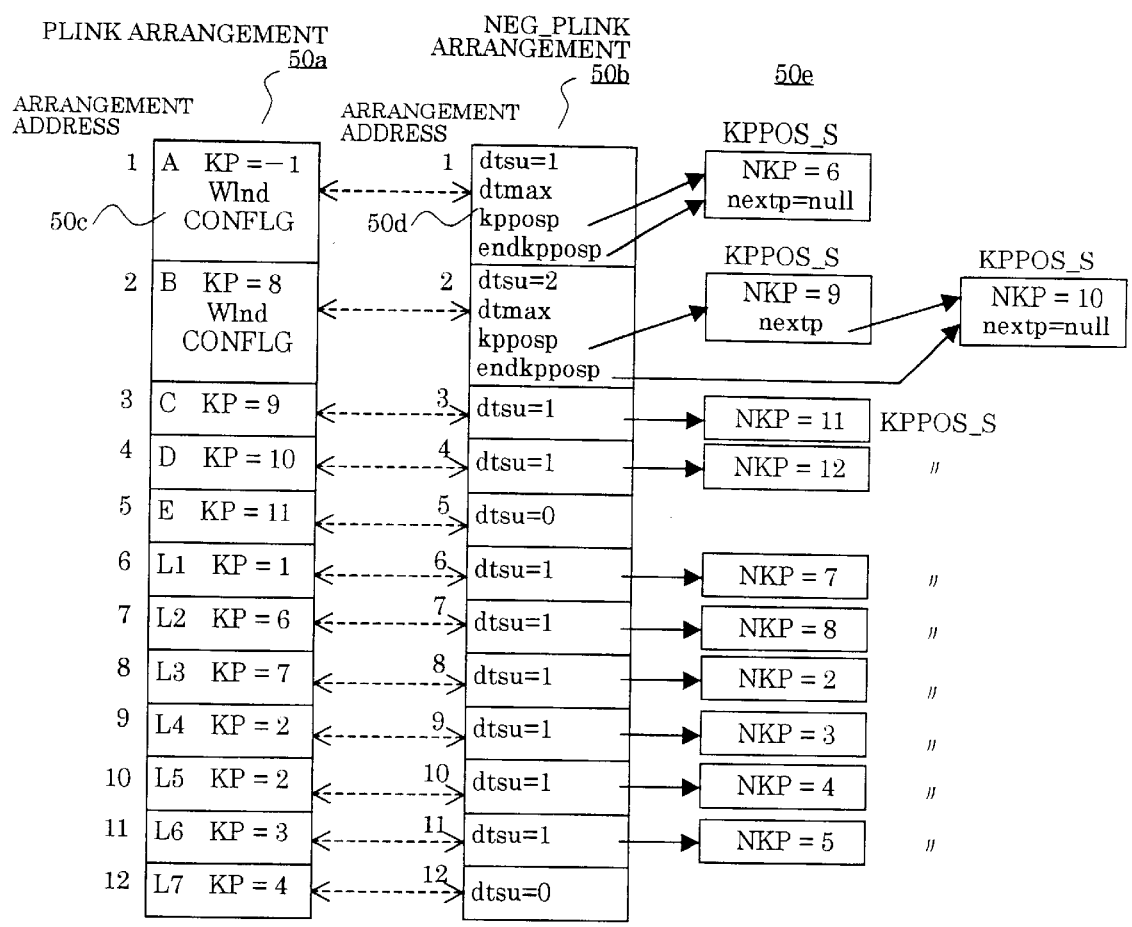
FIG. 10 is a block diagram showing a data structure example of a PLINK table in a method of recognizing a connection of a reconstructing pattern in a printed wiring board according to the present invention.

FIG. 10 shows in detail a structure example of the PLINK table 50 shown in FIG. 5.

The PLINK table 50 is composed of a PLINK arrangement 50a and an NEG_PLINK arrangement 50b.

Each of twelve PLINK arrangement elements 50c of the PLINK arrangement 50a is composed of the KP addresses, Wlnd pointers, and the CONFLG flags.

Each of twelve NEG_PLINK arrangement elements 50d of the NEG_PLINK arrangement 50b is composed of a data number (hereinafter referred to as dtsu number) indicating a valid number of a KPPOS_S structure 50e which each arrangement element 50d manages, a dtmax indicating the maximum number of the KPPOS_S structure 50e which is allowed to be managed, a kpposp pointer which _points the first KPPOS_S structure 50e, and an endkpposp pointer which points the last KPPOS_S structure 50e.

The elements of the PLINK arrangement 60a and the NEG_PLINK arrangement 50b individually correspond to (in synchronization with) each other and are composed of the same number of arrangement elements 50c and 50d.

The KPPOS_S structure 50e is composed of the NKP address and the nextp pointer which points the next KPPOS S structure 50e.

In the KP addresses of the arrangement elements of the arrangement addresses "1–12" in the PLINK arrangement 50a, "−1", "8–4" are set. The dtsu number=1 of the arrangement element 1 of the NEG_PLINK arrangement 50b indicates that the number of the NKP address is single, and the NKP address "6" is set in the KPPOS_S structure 50e which the kpposp pointer points. The dtsu number=2 of the arrangement element 2 indicates that there are two data, the NKP address "9" is set in the KPPOS_S structure 50e which the kpposp pointer points, and the NKP address "10" is set in the KPPOS_S structure 50e pointed by the nextp pointer of the KPPOS_S structure 50e.

Hereafter, the NKP addresses "11", "12", and "7–5" are respectively set in the KPPOS_S structure 50e which the kpposp pointers of the arrangement elements of the arrangement addresses "3", "4", and "6–11" point in the same manner.

In addition, the dtsu number of the arrangement elements of the arrangement addresses "5" and "12" is "0", so that their kpposp pointers (not shown) are set to null to indicate that there is no NKP address.

Figure 11:
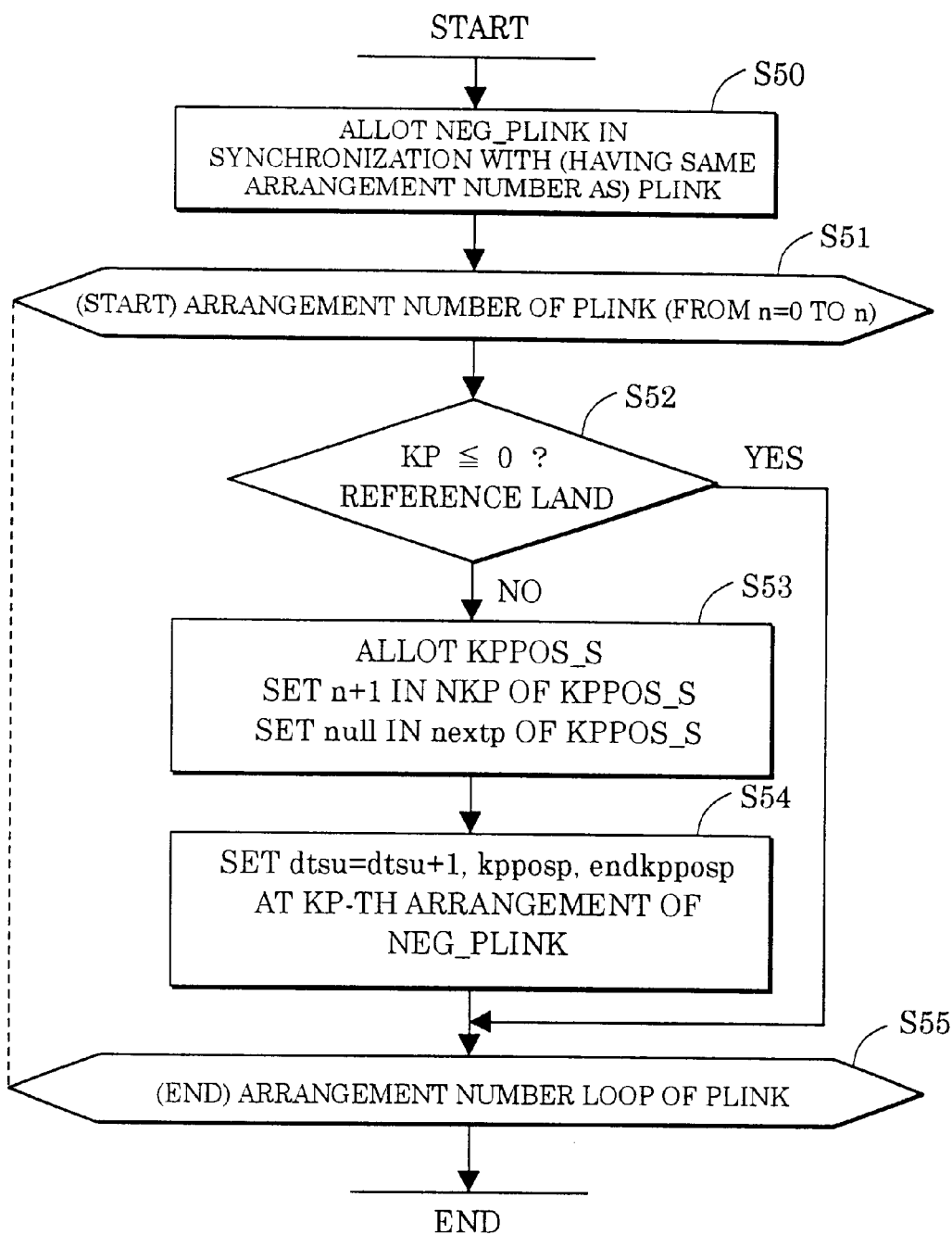
FIG. 11 is a flow chart showing an example of a setting procedure of NKP addresses in a method of recognizing a connection of a reconstructing pattern in a printed wiring board according to the present invention.

FIG. 11 shows an embodiment of the procedure for setting the NKP addresses shown in FIG. 10. Schematically, after the NEG_PLINK arrangements 50b are allotted based on the PLINK arrangements 50a, the NKP addresses are set in the KPPOS_S structures 50e.

After the NEG_PLINK arrangements 50b in synchronization with, or having the same arrangement number as, the PLINK arrangements 50a are allotted at step S50, all of the dtsu numbers of the NEG_PLINK arrangements 50b are set to "0" and the kpposp pointers and the endkpposp pointers are set to "null".

Since the KP address of the arrangement address "1" in the PLINK arrangements 50a is "−1"≦0 at step S52, it is found that the element of the arrangement address "1" is a reference land, so that the process proceeds to the next loop of "n=1" through steps S55 and S51.

Since the KP address of the arrangement address "2" is "8">0 at step S52, the KPPOS_S structure 50e is allotted and "n+1=2" is set in the NKP address (at step S53).

The dtsu number of the arrangement element of the KP address (arrangement address "8") in the NEG_PLINK arrangement 50b is set to "1" by adding "1" so that the KPPOS_S structure 50e newly allotted to the kpposp pointer and the endkpposp pointer may be pointed (at step S54).

The process proceeds to the loop of "n=2", where since the KP address of the arrangement address "3" is "9">0, the KPPOS_S structure 50e is newly allotted at step S52, "n+1=3" is set in the NKP address (at step S53), and the dtsu number of the arrangement address "9" in the NEG_PLINK arrangement 50b is set to "1" so that the KPPOS_S structure 50e newly allotted to the kpposp pointer and the endkpposp pointer may be pointed (at step S54).

Hereafter in the same manner, the KPPOS_S structure 50e is allotted to the arrangement addresses "10", "11", "1", "6", "7", and "2" of the NEG_PLINK arrangement 50b, each NKP address is set to "4–9", and the kpposp pointer and the endkpposp pointer of the NEG PLINK arrangement element 50d are set, so that the dtsu number is set to "1".

In the loop of "n=9", the KPPOS_S structure 50e is further allotted to the arrangement address "2" of the NEG_PLINK arrangement 50b, the NKP address is set to "10", and the endkpposp pointer and the nextp pointer of the previous KPPOS_S structure 50e are set to point a new KPPOS_S structure 50e, so that the dtsu number is set to "2" by adding "1".

In the loop of "n=10" and "n=11", in the same way as the loop of "n=2" "n=9", the dtsu number respectively corresponding to the arrangement addresses "3" and "4" of the NEG_PLINK arrangement 50b is set to "1", the KPPOS_S structure 50e is allotted, and the NKP addresses are set to "11" and "12", so that the kpposp pointer and the endkpposp pointer are set.

The process is ended after going through the loop for setting the NKP addresses.

As a result, it is found that the NKP addresses shown in FIG. 9B have been set in the KPPOS_S structure 50e pointed by the kpposp pointer of the arrangement elements in the NEG_PLINK arrangement 50b. Since the above-mentioned process is performed without referring to the pattern input information table 40, it becomes possible to perform the setting of the NKP addresses at a high speed.

This procedure can be applied to the case where the NKP addresses corresponding to the KP addresses are reset after having set the KP addresses corresponding to a circuit modification.

The KP addresses recognize the physical state toward the land (the reference land) to be remarked, by e.g. a single stroke drawing. Accordingly, it is necessary to reset the KP addresses when the land to be remarked is modified.

Figures 12A, 12B:
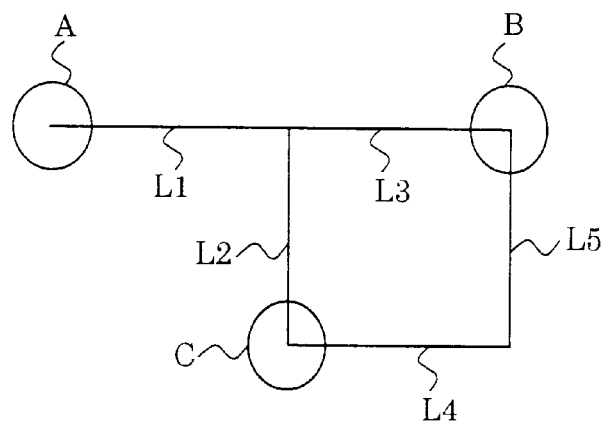
FIGS. 12A and 12B are diagrams showing examples of KP addresses repainted in a method of recognizing a connection of a reconstructing pattern in a printed wiring board according to the present invention.

FIGS. 12A and 12B show embodiments for resetting (repainting) the KP addresses when a reference land is modified. This example shows the repainting of the PLINK table 50 in FIG. 12B corresponding to the net in FIG. 12A.

The KP addresses of FIG. 12B are set with the land A being made a reference land.

Now, when new KP addresses are intended to be set upon modifying the reference land to the land C, the order of recognizing the connection is modified to that of "the land C, the lines L2 and L1, and the land A" obtained by reversing only the connecting path from the last reference land A to the new reference land C, i.e. the land A, the lines L1 and L2, and the land C, for the first KP addresses. At this time, the order of the lines L4 and L5 branched from the land C in relation to the line L2 and that of the line L3 and the land B branched from the line L2 in relation to the line L1 are not modified.

As a result, the new KP addresses of the lands A–C, and the lines L1–L5 respectively assume "4", "6", "−1 (reference)", "5", "3", "5", "3", and "7". In this case, since there is no change in the order of recognizing the connection as mentioned above, the KP addresses of the land B, and the lines L4, L5 are not changed. Since the connecting element which recognizes the connection changes from the line L1 to L2, the KP address of the line L3 is changed.

The procedure of repainting the KP addresses will be described in detail referring to the flow chart shown in FIG. 13.

Schematically describing the procedure, the KP address of the connecting element from the land to be remarked to the last reference land is firstly set at step S60, so that this is made the first KP address.

Through the loop of steps S61 to S68, the KP addresses of arrangement elements to which the first KP addresses are not set are sequentially set.

Specifically, at step S60, the KP addresses of the connecting elements are set in the backward order opposite to the forward connection order from the last reference land to the land to be remarked and are set as the first KP addresses. Furthermore, the first KP addresses are changed to new ones.

As a result, the new KP addresses of the land C, the lines L2 and L1, and the land A are set to "−1", "3", "5", and "4".

The first KP addresses correspond to the addresses of the backward connection with respect to the last reference land, i.e. the NKP addresses. Accordingly, it becomes possible to set the first KP addresses at a high speed by applying the setting procedure of the _NKP addresses shown in FIG. 11 without referring to the pattern input information table 40.

Since the first KP address of the arrangement address "1" (land A) has already been set at step S62 in the loop of "n=1" through steps S61–S68, the process then proceeds to the next loop of "n=2" through steps S68 and S61, at which since the first KP address of the land B is unset (at step S62) and a data classification is a land (at step S63) the last KP address "6" is made a new KP address for the land B (see (D in FIG. 12B).

Since the first KP addresses of the land C, and the lines L1, L2 have already been set in the loop of "n=3" "n=5", nothing is done. The process proceeds to the loop of "n=6", at which since the first KP address of the line L3 is unset (at step S62), the data classification is a line (at step S63), the connecting element which the KP address "4" points is the line L1 (see ② in FIG. 12B; at step S64), and the first KP address of the line L1 is set to "5" (at step S65), the first KP address "5" is made a new KP address for the line L3 (see ③ in FIG. 12B; at step S67).

In the loop of "n=7", since the first KP address of the line L4 is unset (at step S62), the data classification is not a land (at step S63), the connecting element which the KP address "3" points is a land (at step S64), the KP address "3" is made a new KP address for the line L4 (at step S66).

In the loop of "n=8", since the first KP address of the line L5 is unset (at step S62), the data classification is not a land (at step S63), the connecting element which the KP address "7" points is the line L4 (at step S64), the first KP address of the line L4 is unset (at step S62), the KP address "7" is made a new KP address for the line L5 (at step S66).

As a result, it becomes possible to repaint the KP addresses at a high speed based on the KP addresses before repainted. It is also possible to repaint the NKP addresses by setting the NKP addresses based on the KP addresses after repainted at a high speed.

Figure 13:
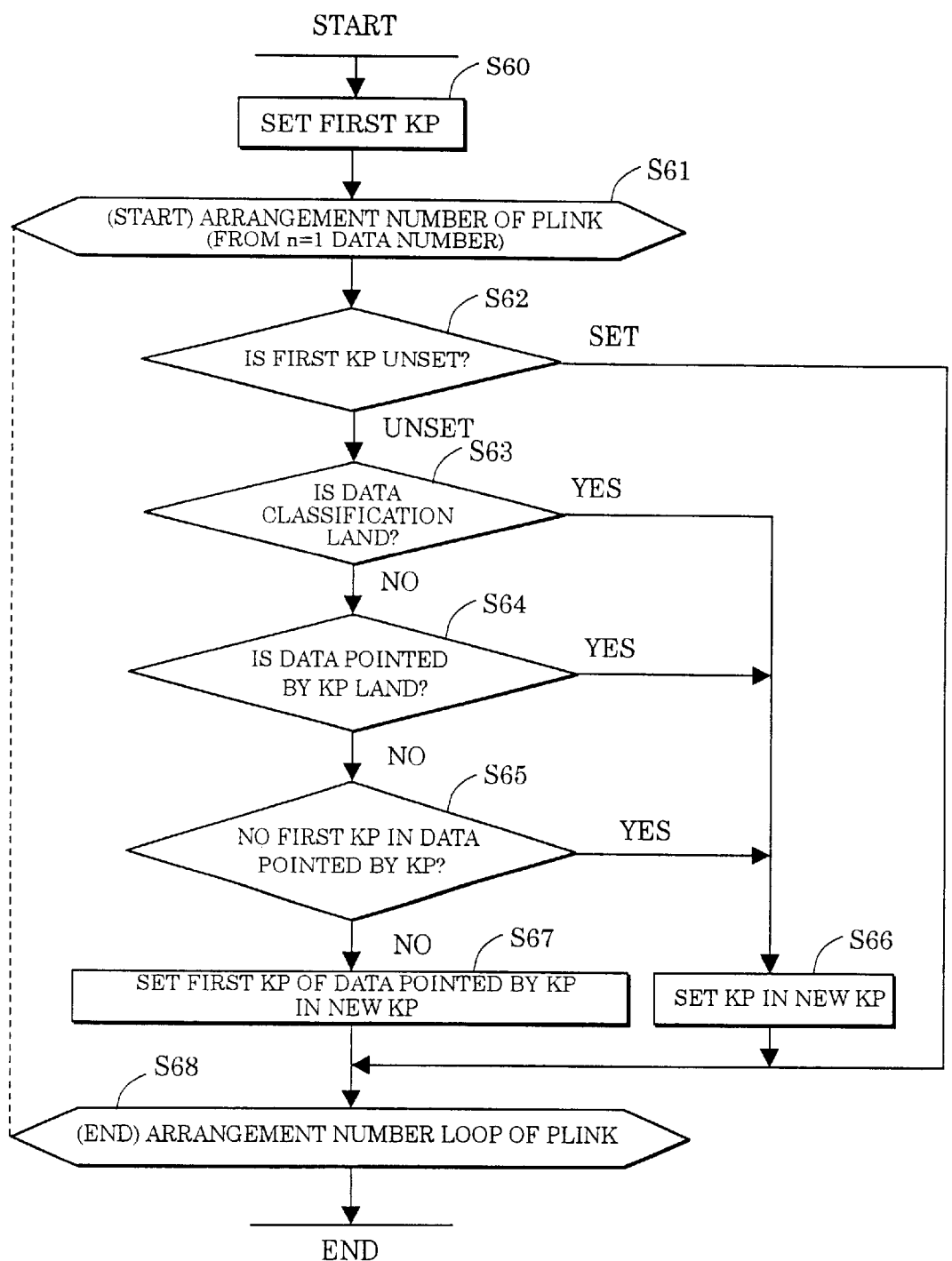
FIG. 13 is a flow chart showing a procedure example for repainting KP addresses in a method of recognizing a connection of a reconstructing pattern in a printed wiring board according to the present invention.
Figures 14A, 14B:
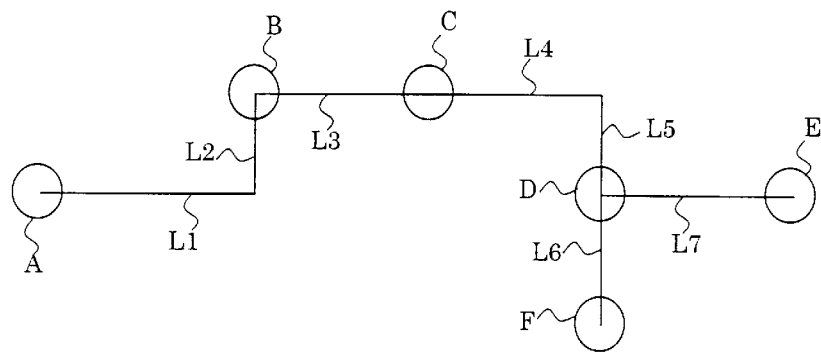
FIGS. 14A and 14B are diagrams showing examples of repainting KP addresses and NKP addresses in a method of recognizing a connection of a reconstructing pattern in a printed wiring board according to the present invention.

FIGS. 14A and 14B show embodiments of a net modification which forms a circuit modification to which the repainting procedure example shown in FIG. 13 is applied. This embodiment shows the case where the land included in the net is separated.

FIG. 14A shows a net composed of the land A, the lines L1 and L2, the land B, the line L3, the land C, the lines L4 and L5, the land D, the line L6, and the land F which are sequentially connected and further composed of the line L7 and the land E branched from the land D which are sequentially connected.

How the land C is separated from this net will now be described.

FIG. 14B shows the PLINK table 50 of the net in FIG. 14A. The KP addresses and the NKP addresses of the table 50 indicate values after having repainted the KP addresses and the NKP addresses as mentioned above with e.g. the land A being made a reference land and with the land C of the separation object being made a reference.

In order to separate the land C, the lines L3 and the L4 are deleted (temporarily cut) whose arrangement address "1" of the land C is set in the KIP address. The lands and lines directly or indirectly connected to the lines L3 and L4 are sequentially specified based on the NKP address with the land C being made a reference and the KP address is set to "−1", as follows:

The KP address when "the lines L3 and L4 are deleted" in the arrangement address "9" of the line L3 is "−1".
The NKP address of the arrangement address "9" is "3".
→The KP address when "the lines L3 and L4 are deleted" in the arrangement address "3" is "−1".
The NKP address of the arrangement address "3" is "8".
→The KP address when "the lines L3 and L4 are deleted" in the arrangement address "8" is "−1".
The NKP address of the arrangement address "8" is "7".
→The KP address when "the lines L3 and L4 are deleted" in the arrangement address "7" is "−1".
The NKP address of the arrangement address "7" is "2"
→The KP address when "the lines L3 and L4 are deleted" in the arrangement address "2" is "−1".
The NKP address of the arrangement address "2" is "−".
→End
The KP address when "the lines L3 and L4 are deleted" in the arrangement address "10" of the line L4 is "−1".
The NKP address of the arrangement address "10" is "11".
→The KP address when "the lines L3 and L4 are deleted" in the arrangement address "11" is "−1".
The NKP address of the arrangement address "11" is "4".
→The KP address when "the lines L3 and L4 are deleted" in the arrangement address "4" is "−1".
The NKP addresses of the arrangement address "4" are "12" and
→The KP address when "the lines L3 and L4 are deleted" in the arrangement addresses "12" and "13" is "−1".
The NKP address of the arrangement address "12" is "6".
→The KP address when "the lines L3 and L4 are deleted" in the arrangement address "6" is "−1".
The NKP address of the arrangement address "6" is "−". the branched arrangement address "13".
The NKP address of the arrangement address "13" is "5".
→The KP address when "the lines L3 and L4 are deleted" in the arrangement address "5" is "−1".
The NKP address of the arrangement address "5" is
→End As a result, the KP addresses and the NKP addresses of the net of only the land C to be remarked can be obtained, while all of the KP addresses assume "−1" since the land C has no connecting element connecting or connected thereto, so that all of the KP addresses assume "−1" and only the NKP address of the land C assumes Hereinafter, the procedure of determining the order of recognizing the connection of the land A when the lines L3 and L4 are cut will be described.

The line L1 is firstly found from the KP address="7" of the land A with the land C being made a reference land, the line L2 is found from the P address="8" of the line L1, the land B is found from the KP address="3" of the line L2, and the line L3 is found from the KP address of the land B, whereby the detection of the connecting element is ended because the line L3 is deleted.

Repainting the P addresses and the NKP addresses of only the detected lands A, B and the lines L1, L2 is performed to end the recognition of the connection. Likewise, the order of recognizing the connection of the land F when the lines L3 and L4 are cut can be determined.

Namely, the KP addresses and the NKP addresses of the net when the lines L3 and L4 are deleted can be determined at a high speed based on the KP addresses with the land C being made a reference.

FIGS. 15A–15D show embodiments combining PLINK tables 50_1 and 50_2 of two nets.

FIG. 15A shows a net NET1, in which the land A, the line L1, the land V1, the lines L2 and L3, the land V2, the line L4, and the land B are sequentially connected in this order, and the line L5 and the land C branched from the land V2 are sequentially connected.

FIG. 15B shows a net NET2, in which the land X, the line L10, the land V3, the line L11, and the land Y are sequentially connected in this order and the line L12 and the land Z branched from the land V3 are sequentially connected.

FIG. 15C shows an embodiment of the PLINK table 50_1 of the net NET1, in which the KP addresses and the NKP addresses are set when the land A is made a reference. Furthermore, the connecting elements of the arrangement addresses "11–18" described later are added to the PLINK table 50_1 besides the connecting elements of the net NET1.

FIG. 15D shows an embodiment of the PLINK table 50_2 of the net NET2, in which the KP addresses and the NKP addresses are set when the land X is made a reference.

Hereinafter, the method of preparing a PLINK table in the case where the net NET1 and the net NET2 are combined by connecting the via V2 and the land X with the jumper J1 (see FIGS. 15A and 15B) will be described.

In FIG. 15C, the arrangement element of the arrangement address "11" for the jumper J1 is added next to the arrangement address "10" of the PLINK table 50_1. Furthermore, the arrangement elements of the arrangement addresses "11–7" shown in FIG. 15D are added next to the arrangement address "11", so that the arrangement addresses are made the arrangement addresses "12–18" obtained by adding the number of "11" to the original arrangement addresses.

The KP address and the NKP address of the jumper J1 are respectively made the arrangement address "5" of the via V2 and the arrangement address "12" of the land X. The KP addresses and the NKP addresses of the arrangement addresses "12–18" are respectively made "11", "17", "18", "16", "12", "15", and "15" as well as "1", "–", "–", "1", "1", "1", "13", and "14" obtained by adding "11" to the KP addresses "0", "6", "7", "5", "1", "4", and "4" as well as the NKP addresses "5", "–", "–", "6", "7", "4", "2", and "3" of the original PLINK table 50_2.

Furthermore, the arrangement address "11" of the jumper J1 is added to the NKP address of the via V2 (shown by parentheses) to complete the preparation of the combined PLINK table.

Accordingly, the PLINK table where two nets are combined is prepared from the original table at a high speed, so that it becomes possible to recognize the connection.

It is to be noted that the combination of two or more nets may be performed by repeating the combination of two nets.

Figures 16A, 16B:
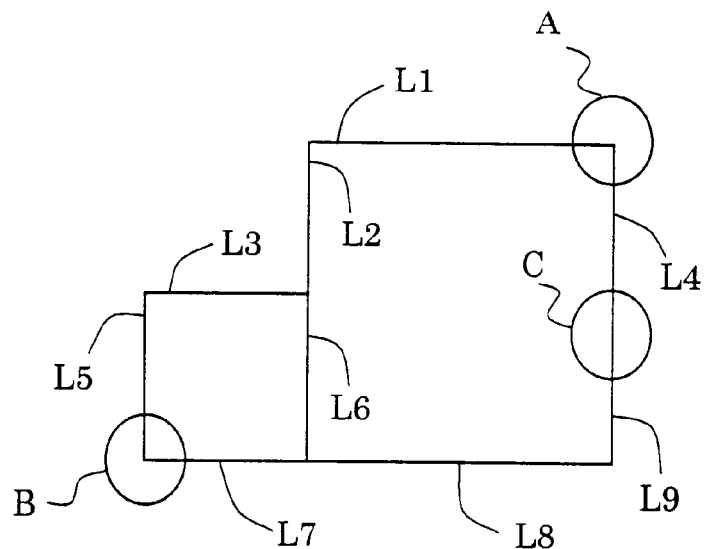
FIGS. 16A and 16B are diagrams showing examples of a loop pattern recognition according to KP addresses and NKP addresses in a method of recognizing a connection of a reconstructing pattern in a printed wiring board according to the present invention.

FIGS. 16A and 16B show embodiments of recognizing a connection of the net having a loop pattern.

FIG. 16A shows a net, in which the land B, the lines L7, L6, L2, L1 and the land A are sequentially connected in this order. Furthermore, the Lines L5 and L3 are sequentially connected in this order to the land B, and the line L3 is connected to the joint of the lines L2 and L6. Furthermore, from the joint of the lines L7 and L6, the lines L8, L9, the land C, the line L4, and the land A are sequentially connected in this order.

Accordingly, in the net of FIG. 16A, the pattern loop of the land B, the lines L5, L3, L6, L7, and the land B as well as the pattern loop of the lines L6, L2, L1, the land A, the line L4, the land C, the lines L9, L8, and the line L6 are formed.

FIG. 16B shows an embodiment of the PLINK table 50 of the net of FIG. 16A. The KP addresses and the NKP addresses of the embodiment are set when the land B is made a reference land in accordance with the connection order, the land B→the lines L7, L6, L2, L1→the land A; the connection order, the land B→the lines L5, L3; as well as the connection order, the lines L7, L8, L9→the land C→the line L4.

Accordingly, it is not recognized only by the KP addresses that the line L3 is connected to the joint of the lines L2 and L6 and that the line L4 is connected to the land A. Namely, it is not recognized only by the KP addresses that the net forms the above-mentioned loop pattern.

On the other hand, "–" indicating that there is no connection is set in the NKP addresses of the lines L3 and L4. This is because the NKP addresses indicating the backward connection are set based on the KP addresses.

Accordingly, it is determined that a loop pattern can be formed by the lines where the NKP addresses are set to "–".

Figure 17:
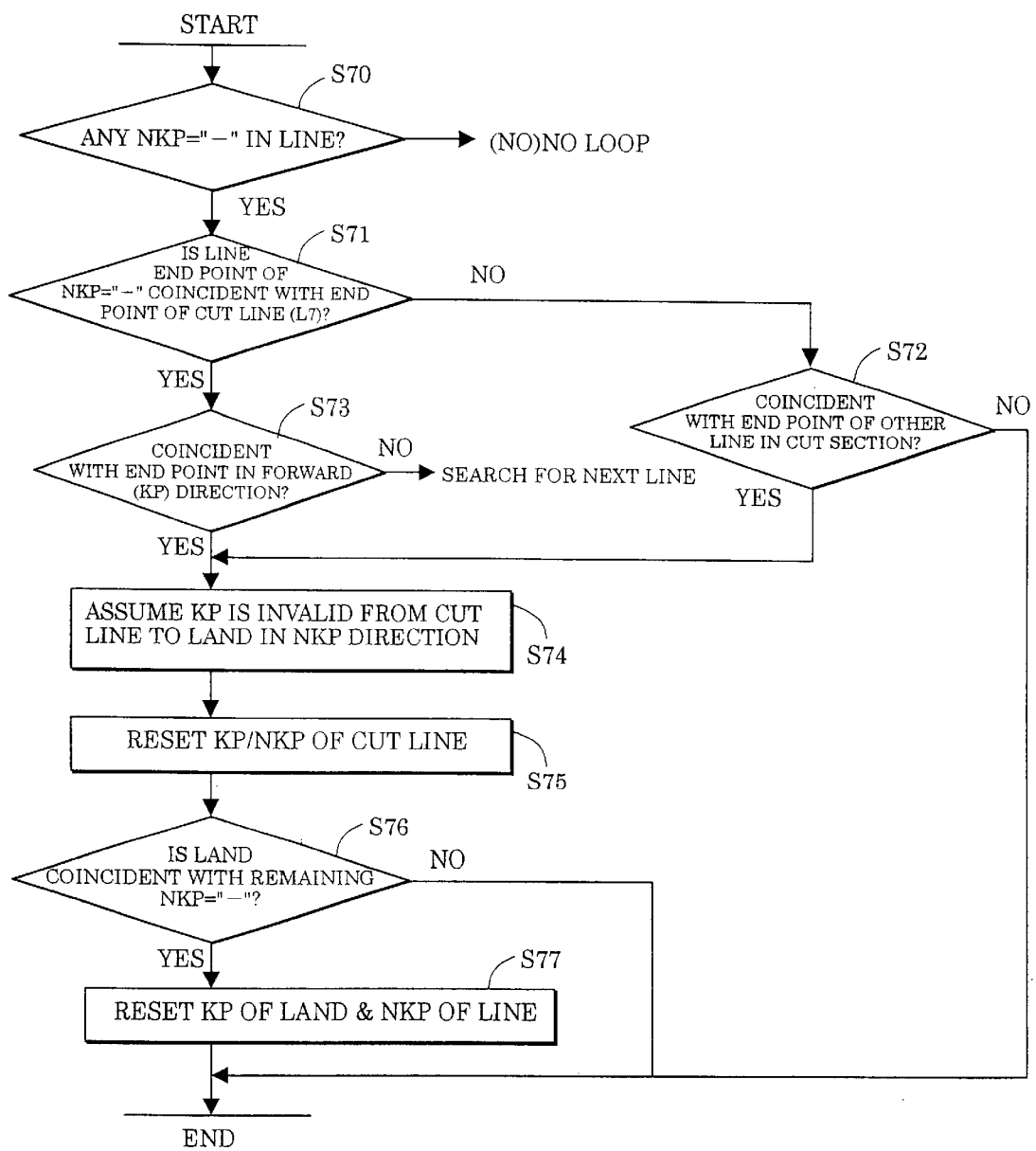
FIG. 17 is a flow chart showing a procedure of a loop pattern recognition according to KP addresses and NKP addresses in a method of recognizing a connection of a reconstructing pattern in a printed wiring board according to the present invention.

FIG. 17 shows a procedure example for recognizing the loop pattern by the KP addresses and the NKP addresses of the PLINK table.

This procedure example shows a recognition example of the loop pattern required e.g. when the land B is separated from the lands A and C in the net of FIG. 16A.

The line L7 commonly included in the connection order, the land B→the lines L7, L6, L2, L1→the land A; and the connection order, the lines L7, L8, L9 the land C→the line L4 shown in the PLINK table 50 in FIG. 16B, is determined as the cut line for separation.

Schematically describing the procedure, firstly, when a line having the NKP address "–" is searched with the result that there is the line, it is determined that there is a loop pattern. In this case, it is then confirmed whether or not the line according to the connection order from the cut line to the lands A and C is not connected to the line having the NKP address "–". When they are mutually connected, it is determined that there is a second route (connection order) which connects the land B to the lands A and C except the cut line.

At step S70, when the line having the NKP address "–" is searched with the result that there is no corresponding line, the process is ended because of no loop. When there is the line having the NKP address the coordinate of the cut line L7 is compared with that of the end point of the lines L3 and L4 having the NKP addresses "–" (at step S71). When they are coincident with each other, it is then determined whether or not the coincident end point is the end point on the opposite side to the land B of the cutting line L7 (end point in the forward connection direction). If it is the case, the process proceeds to step S74.

At step S71, since the coordinates of the lines L3, L4 and the cut line L7 are not coincident each other in FIG. 16A, the process proceeds to step S72. At this step, the coordinates of the lines L6, L2, L1 and the lines L3 and L4 in the connection order from the cut line L7 to the land A are mutually compared. When they are not coincident, the procedure is ended because of no loop. When they are coincident, the process proceeds to step S74.

Since the end points of the lines L3, L2, and L6 are coincident, the process proceeds to step S74, at which the KP addresses of the connecting elements from the cut line L7 to the land B in the backward connection order are set to "–". Also, the KP addresses and NKP addresses of the cut line L7 are set to "–" (at step S75).

Furthermore, whether or not the remaining lines and lands having the NKP addresses "–" are mutually coincident is determined (at step S76), and the procedure is ended when they are not mutually L6 coincident. When they are mutually coincident, the KP addresses of the coincident land and the NKP addresses of the coincident line are reset (at step S77).

As a result, the KP address of the line L3 assumes "8", the NKP address of the line L3 assumes "9", the KP address of the line L6 assumes "6", and the NKP address of the line L6 assumes "5" and "6".

Figure 18A:
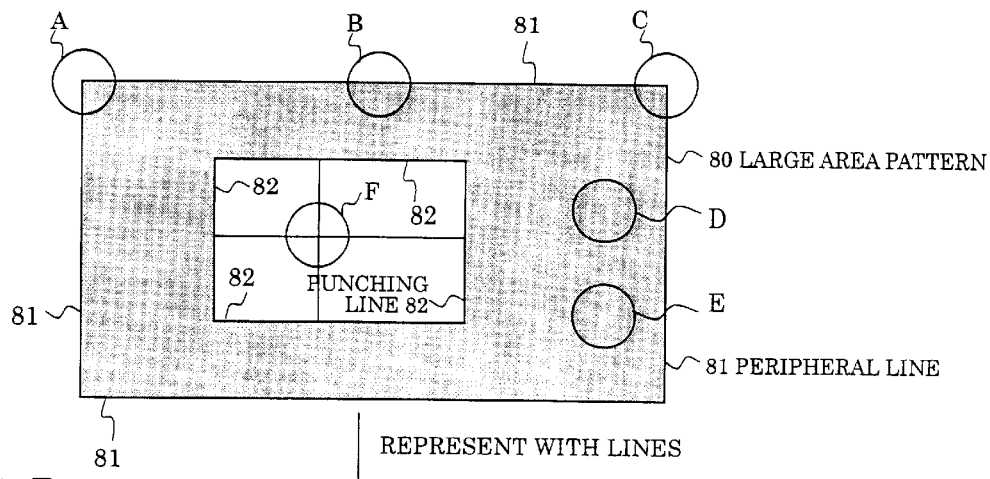
FIGS. 18A–18C are diagrams showing examples of a connecting recognition and a cutting recognition of a large area pattern in a method of recognizing a connection of a reconstructing pattern in a printed wiring board according to the present invention.
Figure 18B:
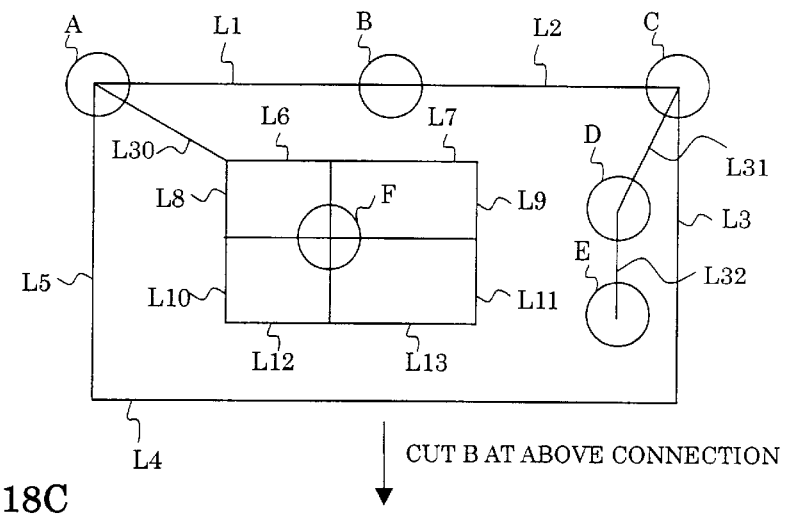
Figure 18C:
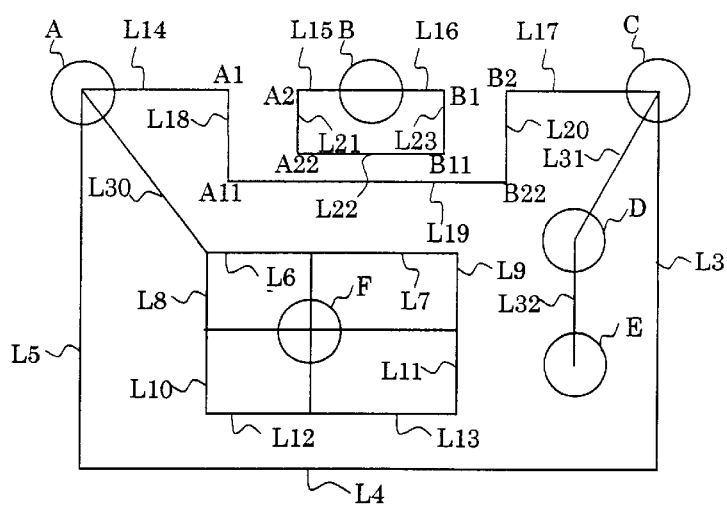

FIGS. 18A–18C show embodiments of recognizing the connection and the cutting of a large area pattern.

FIG. 18A shows a large area pattern 80, which is a pattern illustrated as a hatched portion, surrounded by a peripheral line 81 and a punching line 82. In addition, the lands A–C on the peripheral line 81 and the lands D and E included in the large area pattern 80 are shown. Furthermore, inside the punching line 82, the land F is connected to the large area pattern 80 with lines.

In FIG. 18B, the large area pattern 80 of FIG. 18A is regarded as being composed of the peripheral line 81, the lines L1–L5, the lines L6,=L13 which form the punching line 82, and an imaginary line L30 which connects the peripheral line 81 to the punching line 82.

As a result, it becomes unnecessary to perform recognizing the connection of the large area pattern 80 by a diagram operation, enabling the same to be performed at a high speed and with a less memory consumption.

Also, the lands A–C on the peripheral line 81 are regarded as being respectively connected to the lines L1 and L5, the lines L1, L2, and the lines L2, L3.

Furthermore, the land D included in the large area pattern 80 is regarded as being connected to the land C with an imaginary line L31, and the land E is regarded as being connected to the land D with an imaginary line L32.

As a result, it becomes possible to perform recognizing the connection of the land included in the large area pattern 80 at a high speed.

FIG. 18C shows an embodiment of recognizing a connection when the large area pattern 80 of FIG. 18A is cut, in which a part of the large area pattern 80 is cut for separating the land B from the large area pattern 80.

Namely, the large area pattern 80 is cut with cutting lines A1, A11, B22, B2 and cutting lines A2, A22, B11, B1 to remove a pattern formed of A1, A11, B22, B2, B1, B11, A22, A2, and A1.

The large area pattern 80 is regarded as being the combination of a group of lines L14, L18, L19, L20, L17, L3, L4, L5, L30, and L6–L13 and a group, separated from the above-mentioned group, of lines L16, L15, L21, L22, and L23.

As a result, the large area pattern, from which the land B is separated by cutting the large area pattern 80, and the large area pattern to which the land B belongs are respectively regarded as being a line group, so that it becomes possible to recognize the connection of the large area pattern 80 as cut at a high speed.

It is to be noted that when the land B is merely separated from the large area pattern 80 and besides the cut portion is significant, the cutting is performed as shown in FIG. 18C, while when it is not so the large area pattern 80 may be regarded as being a line as shown in FIG. 18B, thereby cutting the lines L1 and L2 connected to the land B.

Also, hereinafter such a large area pattern which is regarded as being a line will be occasionally referred to as a large area connecting pattern.

Figure 19A:
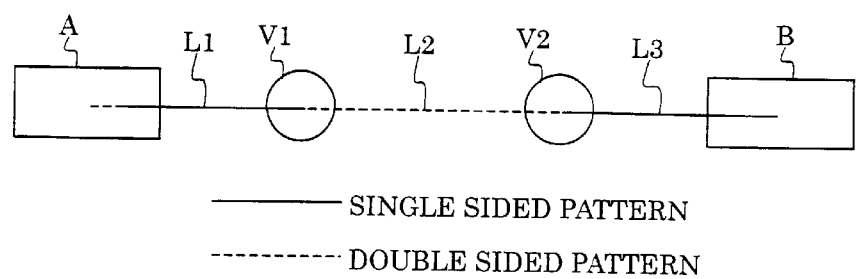
FIGS. 19A–19C are diagrams showing examples of a priority order decision of a line cutting in a method of recognizing a connection of a reconstructing pattern in a printed wiring board according to the present invention.
Figure 19B:
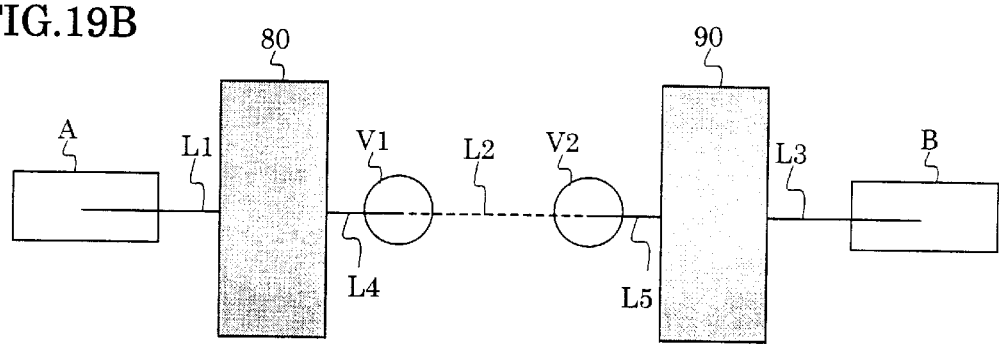
Figure 19C:
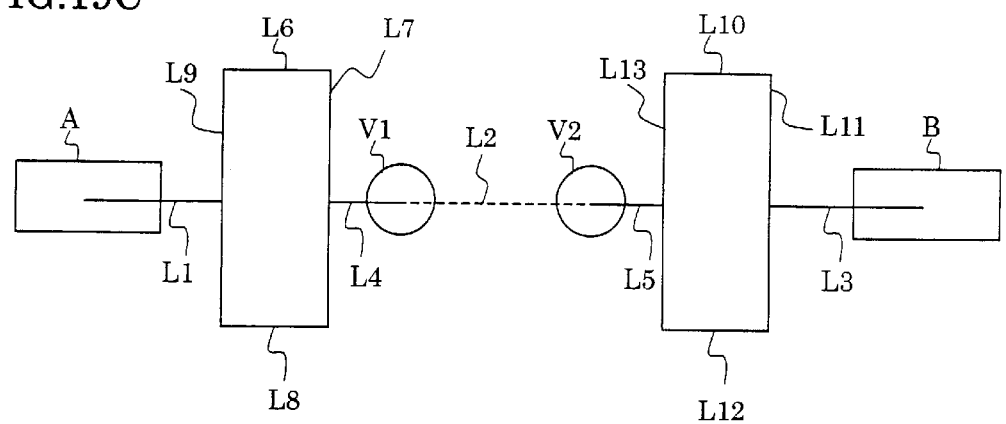

FIGS. 19A–19C show embodiments of a line cutting in the net including the large area pattern, in which a priority order of the line cutting is designated. Namely, the priority order is designated for the attribute which the line possesses, so that the line is cut according to the priority order.

Particularly, FIG. 19A shows a net excluding the large area pattern, in which the land A, the line L1, the via V1, the line L2, the via V2, the line L3, and the land B are sequentially connected in this order.

It is to be noted that solid lines in the figure indicate lines of a single sided pattern, while dashed lines indicate lines of a double sided pattern.

The lands A and B are for SMD parts, the vias V1 and V2 are for drawing the lands A and B, and the connection of the terminals of the SMD parts and the jumper for drawing is to be performed by using vias.

The priority orders of the cutting are; (①) the pattern between the via V1 and the via V2; (②) the pattern between the land A and the via Accordingly, when the land A should be separated from the land B, the line L2 is to be cut. When the line L2 for example can not be physically cut, either the line L1 or the line L3 is to be cut.

FIG. 19B shows a net including the large area pattern. In this net, the line L1 which is a pattern between the land A and the via V1 of FIG. 19A is replaced by the line L1, the large area pattern 80, and the line L4, and the Line L3 which is a pattern between the land B and the via V2 of FIG. 19A is replaced by the line L5, a large area pattern 90, and the line L3.

Since a conventional line cutting has a priority in the recognition of the pattern connected to the large area pattern, the vias V1 and V2 can not be treated as the vias for drawing.

Accordingly, if the cutting process of lines is performed in the net of FIG. 19B, e.g. the line L1 between the land A and the large area pattern 80 or the line L4 between the large area pattern 80 and the via V1 except the pattern (line L2) between the via V1 and the via V2 are cut.

Namely, the lines are to be cut without considering the priority order.

In the present invention, large area patterns 80 and 90 of FIG. 19B are respectively regarded as being formed of the lines L6–L9 and the lines L10–L13, as shown in FIG. 19C.

The cutting process of the line in the net of FIG. 19C is performed by designating the above-mentioned priority order. As a result, the line L2 which is a pattern between the via V1 and the via V2 is cut, while the lines L1, L4, and L6–L9 forming a pattern between the land A and the via V1 as well as the lines L3, L5, and L10–L13 forming a pattern between the land B and the via V2 are not cut.

Since the large area pattern is treated as a line in the embodiment, the operation of a diagram process is not required.

As a result, it becomes possible to perform the cutting process of the lines to which the cutting priority order is designated at a high speed in the net including the large area pattern.

Figure 20A:
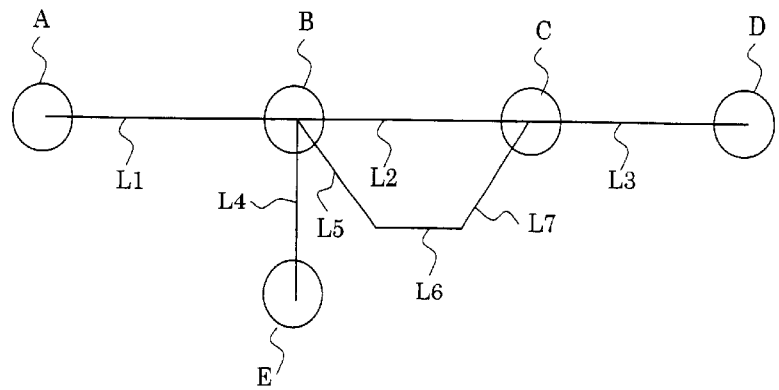
FIGS. 20A–20C are diagrams showing examples of a connecting element recognition method for a general printed wiring board.
Figure 20B:
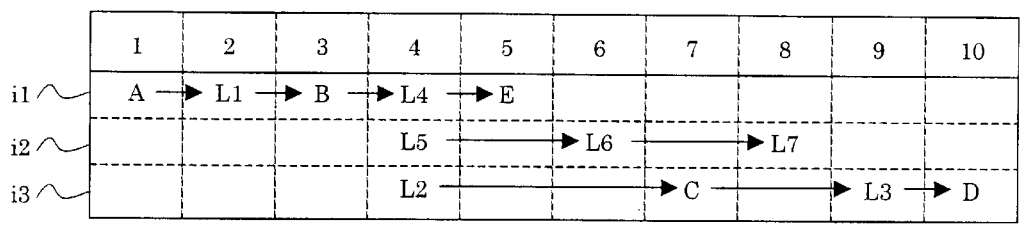
Figure 20C:
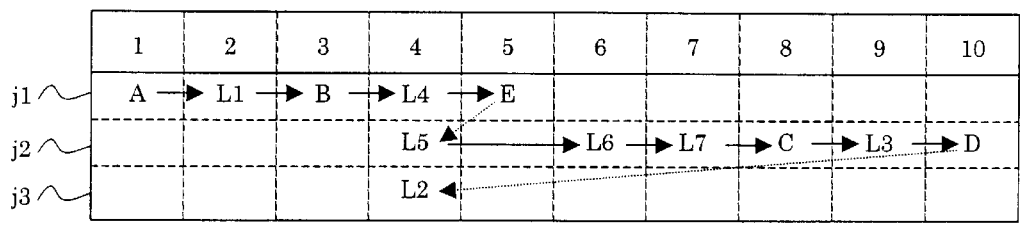

FIGS. 20A–20C show embodiments of methods of recognizing connecting elements from the reference land, such as the undulant type-connecting element recognition method and the connecting element-unique decision method.

Particularly, FIG. 20A shows a net in which the land A, the line L1, the land B, the line L2, the land C, the line L3, and the land D are sequentially connected in this order, the line L4 and land E branched from the land B are sequentially connected, the lines L5–L7 further branched from the land B are sequentially connected, and the other end point of the line L7 is connected to the land C.

FIG. 20B shows the case where the connection order of the net of FIG. 20A is determined by the undulant type-connecting element recognition method from the reference land A. The connection order in a row i1 (the land A, the line L1, and the land B) is firstly determined. As a wave spreads with the land B as the center figure, the connecting element branches to the lines L4, L5, and L2 of rows i1, i2, and i3 respectively. The next single connecting element for every row (the and E, the line L6, and the land C) is determined. Hereafter, the connecting element (*, the line L7, and the line L3), the connecting element (*, *, and the land D) are determined in the same manner.

It is to be noted that the symbol "*" in the above indicates that no connecting element remains.

As a result, the net is connected in the order of the land A, the line L1, the land B, the line L4, and the land E (the row i1), the lines L5–L7 are branched from the land B to be sequentially connected (the row i2), and the line L2, the land C, the line L3, and the land D are branched from the land B to be sequentially connected (the row i3). FIG. 20C shows the case where the connection order of the same net is determined by the connecting element-unique decision method.

The connection order of the row i1 (the land A, the line L1, the land B, the line L4, and the land E) is sequentially searched uniquely up to the land E which has no connecting destination, to be determined. Next, a the connection order branched from the land B (the land B, the lines L5–L7, the land C, the line L3, and the land D) is sequentially searched up to the land D which has no connecting destination, to be determined.

The connection order branched from the land B (the land B, the line L2) is searched up to the line L2 which has not yet been registered in the connection order and has no connecting destination, to be sequentially determined.

FIG. 20B being compared with FIG. 20C, it is found that the connection order of the same net is different according to the recognition method of the connecting elements.

Either of the undulant type-connecting element recognition method or the connecting element-unique decision method can be applied to the above mentioned embodiments (see FIGS. 3, 6, 9, and the like).

Figure 21:
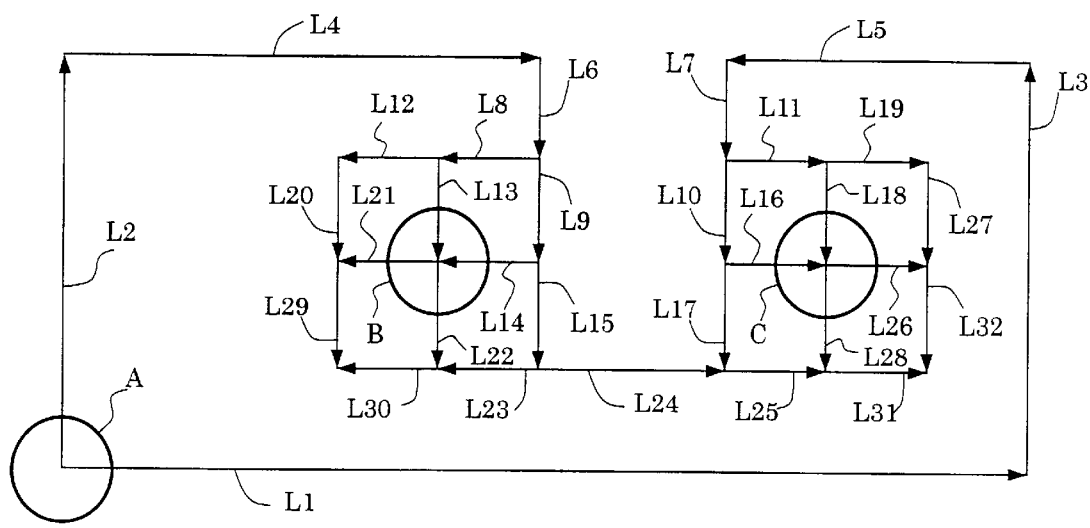
FIG. 21 is a diagram showing an application example (1) of an undulant type-connecting element recognition method for a large area connecting pattern in a method of recognizing a connection of a reconstructing pattern in a printed wiring board according to the present invention.

FIG. 21 shows a net example where the large area pattern is regarded as the combination of peripheral lines and punching lines. The net is composed of the lands A, B, C, and the lines L1–L30.

In the net, the connection of the land A, and the lands B, C can be recognized by the undulant type-connecting element recognition method in which the land A is made a reference land. However, even if the KP addresses are repainted with the land B being made a reference land, the connection of the lands B and C can not be recognized. This is because the lands B and C can not go out of their own loops.

Figures 22A, 22B, 22C:
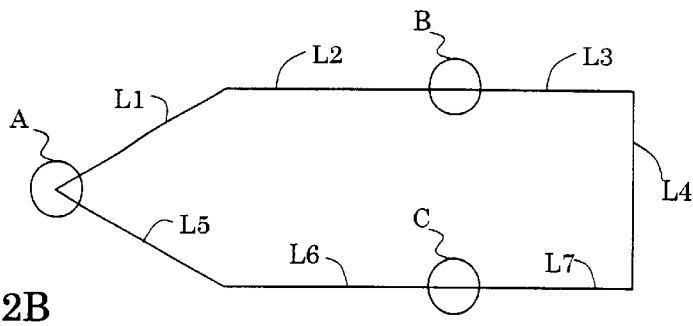
FIGS. 22A–22C are diagrams showing application examples (2) of an undulant type-connecting element recognition method for a large area connecting pattern in a method of recognizing a connection of a reconstructing pattern in a printed wiring board according to the present invention.

FIGS. 22A–22C show embodiments of a net where a simple large area pattern whose connection can not be recognized by the undulant type-connecting element recognition method as mentioned above is regarded as lines.

Particularly, FIG. 22A shows a net where the large area pattern including the lands A–C is regarded as lines. Describing the net by recognizing the connection according to the undulant type method with the land A being made a reference, the lines L1 and L5 are connected to the land A, the lines L2 and L6 are respectively connected to the lines L1 and L5, the lands B and C are respectively connected to the lines L2 and L6, the lines L3 and L7 are respectively connected to the lands B and C, and the line L4 is further connected to the line L3. Recognizing the connection of the net is hereby ended. Accordingly, it is not recognized that the line L7 and the line L4 are mutually connected.

FIG. 22B shows the WLND table 20 and the WLIN table 30 of the net of FIG. 22A. The WKPTR pointers and the FLG flags with the land A being made a reference land are respectively set in the WLND table and WLIN table 30 by the procedure shown in FIG. 4.

FIG. 22C shows the PLINK table 50 of the net of FIG. 22A, in which the KP addresses of the table 50 are set based on the WKPTR pointers and the FLG flags of the WLND table 20 and the WLIN table 30 of FIG. 22B by the procedure shown in FIG. 8. The NKP addresses are set based on the KP addresses by the procedure shown in FIG. 11.

The arrows of the PLINK table 50 point the connecting elements which the set KP addresses designate. The KP address "1", for instance, points the land A of the arrangement address "1" by the arrows from the lines L1 and L5. This means that the lines L1 and L5 are connected to the land A.

The lands A–C, and the lines L1–L3, L5, L6 of the PLINK table 50 are pointed by the arrows, while the lines L4 and L7 are not pointed by the arrows. Accordingly, it is found that the KP addresses of the PLINK table 50 do not recognize that the lines L4 and L7 are connected.

This can also be found from the fact that the arrangement addresses "7" and "10" of the lines L4 and L7 are not set in the KP addresses.

In addition, it is found that the connection of the lines L4 and L7 is not recognized from the fact that the NKP addresses of the lines L4 and L7 are set to "–". This is because the NKP addresses are set based on the KP addresses.

Thus, when new KP addresses and new NKP addresses are set with the land B being made a reference land based on the KP addresses with the land A being made a reference land, it is confirmed that the connection of the lines L4 and L7 can not be recognized by the new KP addresses and the new NKP addresses.

The new KP addresses of FIG. 22C are the KP addresses in the case where the last KP addresses are repainted with the land B being made a reference land, while the new NKP addresses are the NKP addresses set based on the new KP addresses.

From the fact that the arrangement addresses "7" and "10" of the lines L4 and L7 are not set in the new KP addresses and the new NKP addresses of the lines L4 and L7 are set to "–", it is found that both the new KP addresses and the new NKP addresses do not serve to recognize the connection of the land L4 and L7. This is because the new KP addresses and the new NKP addresses are set based on the KP addresses.

Accordingly, it can not be recognized that the lands B and C are connected through the lines L3, L4, and L7. However, when the large area connecting pattern is cut and the lines L1 and L5 are deleted in order to perform the circuit modification for separating the land A for instance, it is required to recognize whether or not the lands B and C are directly connected.

Figures 23A, 23B:
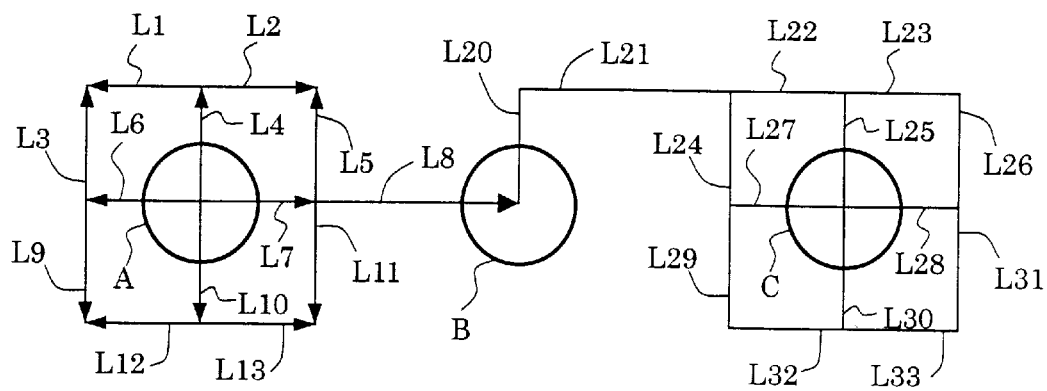
FIGS. 23A and 23B are diagrams showing application examples (3) of an undulant type-connecting element recognition method for a large area connecting pattern in a method of recognizing a connection of a reconstructing pattern in a printed wiring board according to the present invention.

FIGS. 23A and 23B show embodiments for recognizing the connection of the large area connecting pattern by the undulant type-connecting element recognition method.

Particularly, FIG. 23A shows a part of the net of the large area connecting pattern, in which the lands A and B are connected with the lines L1–L13 and the lands B and C are connected with the lines L20–L33.

FIG. 23B shows the PLINK table 50 for recognizing the connection between the lands A and B of the net in FIG. 23A. The PLINK table 50 determines the connection order (direction) by the undulant type-connecting element recognition method with the land A being made a reference land to set the KP addresses and the NKP addresses.

In FIG. 23A, the arrows of the lines L1–L13 show the connecting direction determined by the undulant type-connecting element recognition method.

Accordingly, the joint of a line and a line where the points of the arrows gather and no destination arrow exists is a joint whose connection is not recognized. The KP addresses and the NKP addresses of the PLINK table 50 do not recognize the connection of the joint between the lines L2 and L5, between the lines L1 and L3, between the lines L9 and L12, and between the lines L11 and L13. This is found from the fact that the NKP addresses of the PLINK table 50 are set to "–". Accordingly, it is found from the fact that the connection between the land A and the land B is recognized only by the route of the connection order, i.e. the land A the line L7 the line L8 the land B.

Hereinafter, the circuit modification for separating the land A from the land B will be described.

The PLINK table 50 shows that it is suitable to cut either the line L7 or the line L8 for separating the land A from the land B. Therefore, the line L7 is cut.

In order to recognize the connection which the PLINK table 50 does not recognize, the PLINK table 50 excluding the line L7 is prepared again, and determines whether or not the lands A and B are mutually connected. As a result, when they are not mutually connected the process is ended, while when they are mutually connected the lines on the way are deleted to prepare the PLINK table 50. This is repeated until it is shown that the lands A and B are not mutually connected.

It takes time to prepare the PLINK table 50 since the connection of the lands and lines is recognized referring to a coordinate.

Figure 24:
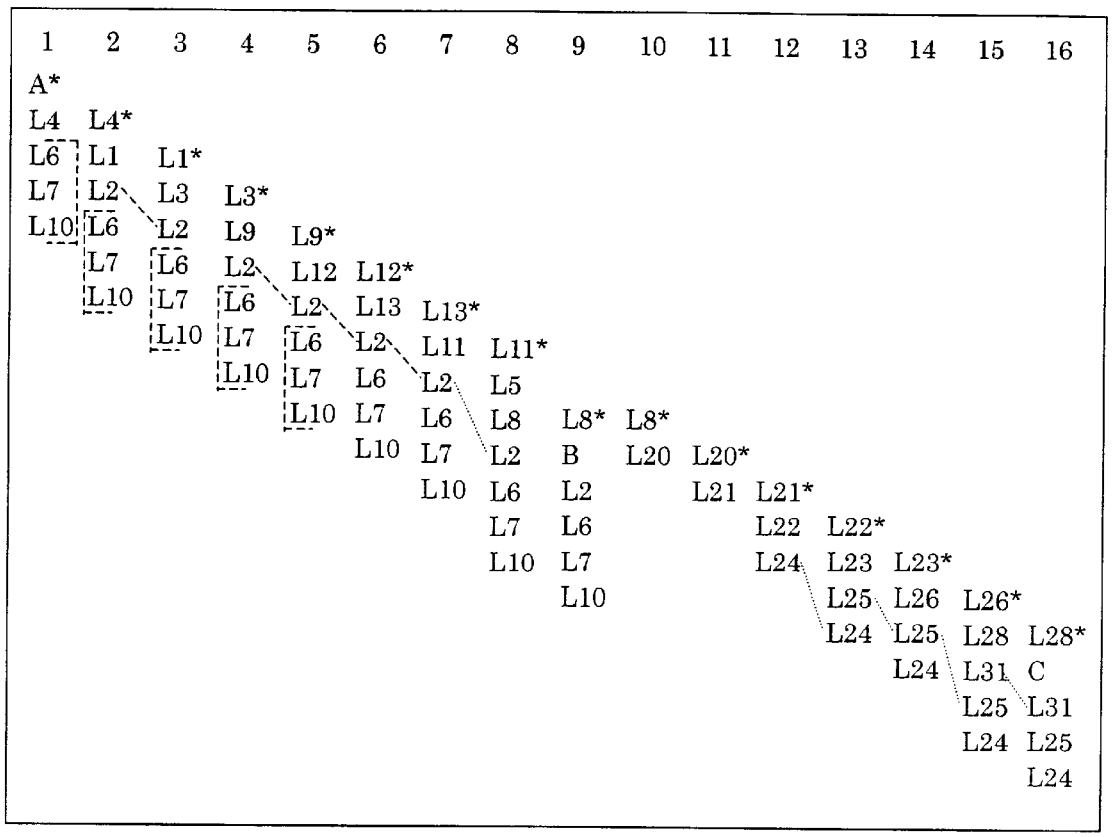
FIG. 24 is a diagram showing an application example of a connecting element-unique decision method for a large area connecting pattern in a method of recognizing a connection of a reconstructing pattern in a printed wiring board according to the present invention.

FIG. 24 shows an embodiment for determining the connection order of the net of the large area connecting pattern shown in FIG. 23A by the connecting element-unique decision method.

The lines L4, L6, L7, and L10 connected to the reference land A are firstly recognized (at the first row). When the line L4 is remarked as illustrated by an affix "*" in FIG. 24 indicating a connecting element to be remarked, the lines L1 and L2 connected to the line L4 are inserted under the line L4, and the lines L6, L7, and L10 having previously been existed under the line L4 are now connected under the line L2 (at the second row).

Hereafter, 3rd–9th rows are determined with the connecting elements to be remarked being made the lines L1, L3, L9, L12, L13, L11, and L8 in the same manner. As a result, it is recognized that the and B is connected to the land A through the lines L4, L1, L3, L9, L12, L13, L11, and L8. Likewise, 10th–16th rows are determined, whereby it is recognized that the lands B and C are mutually connected through the lines L20, L21, L22, L23, L26, and L28.

FIG. 25 shows the PLINK table 50 in which the KP addresses and NKP addresses are set in the connection order determined by the connecting element-unique decision method in FIG. 24.

In the PLINK table 50, when the line L8 is cut in order to separate the land A to be remarked from the net, it is found that the KP addresses indicate that the lands B and C are mutually connected in the connection order, i.e. the land B→the lines L20–L23, L26 and L28→the land C.

Accordingly, in the case of the large area connecting pattern, it is sufficient to set the KP addresses only once with the land to be remarked at an initial time being made a reference, so that it is possible to perform the following recognition of a connection based on the KP addresses and the NKP addresses.

As a result, it becomes possible to perform the recognition of the circuit modification at a high speed.

Figure 26A:
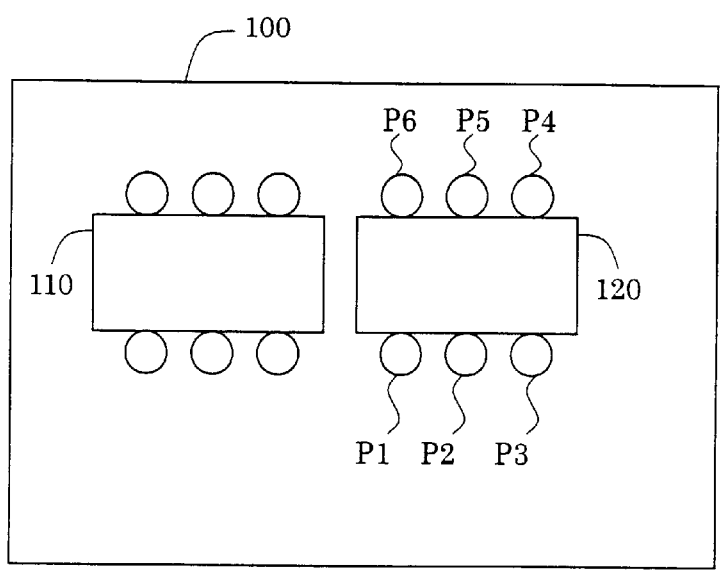
FIGS. 26A and 26B are diagrams showing recognition examples of external parts in a method of recognizing a connection of a reconstructing pattern in a printed wiring board according to the present invention.
Figure 26B:
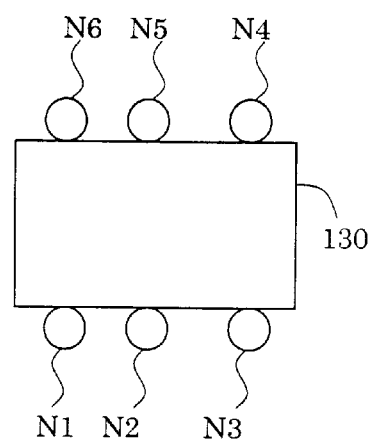
Figure 27A:
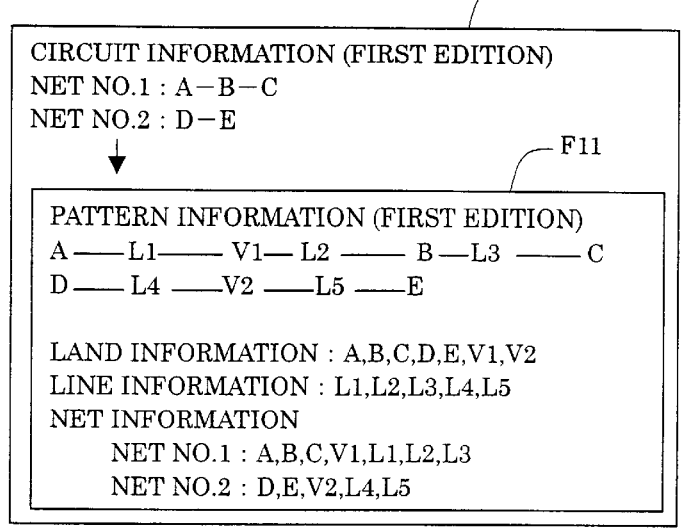
FIGS. 27A–27C are block diagrams showing examples of a pattern connecting recognition according to a net number in a conventional method of recognizing a connection of a reconstructing pattern in a printed wiring board.
Figure 27B:
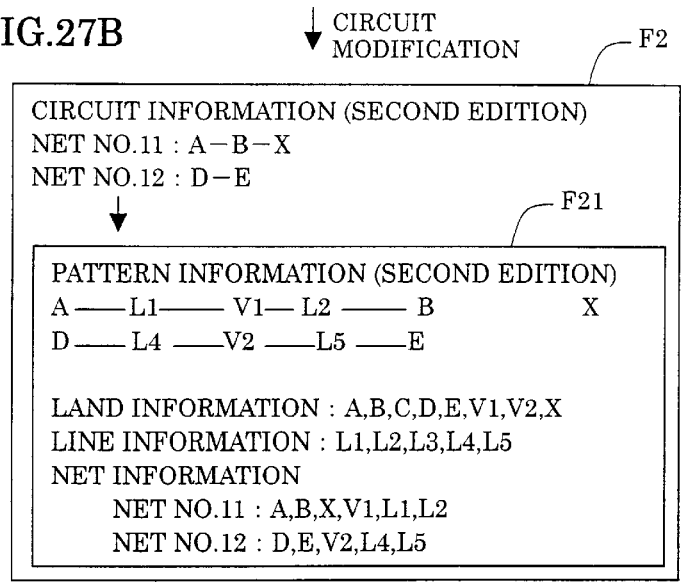
Figure 27C:
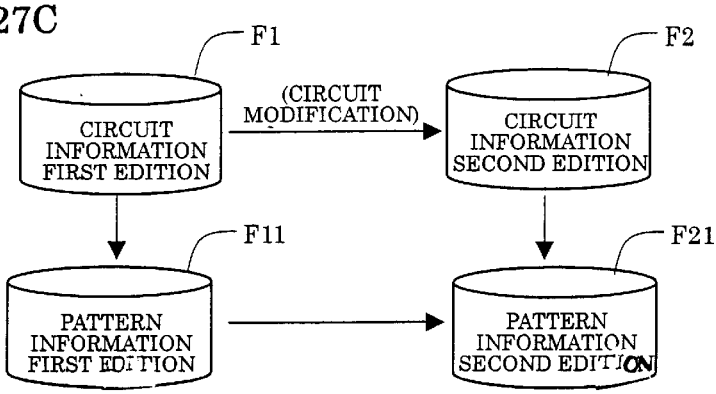
Figure 28A:
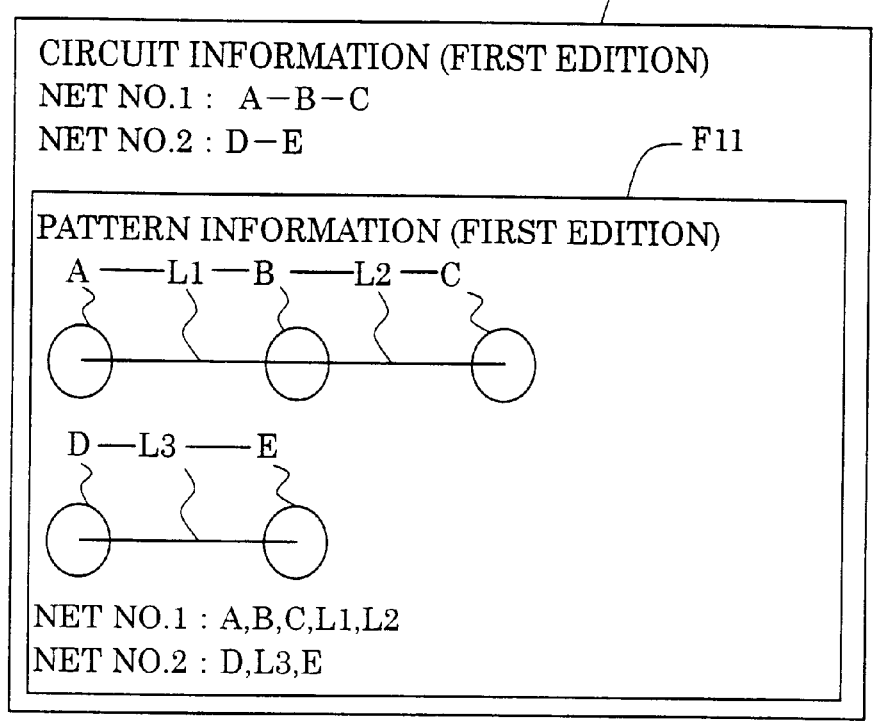
FIGS. 28A and 28B are diagrams showing examples of a pattern connecting recognition which has no modification diagram information in a conventional method of recognizing a connection of a reconstructing pattern in a printed wiring board.
Figure 28B:
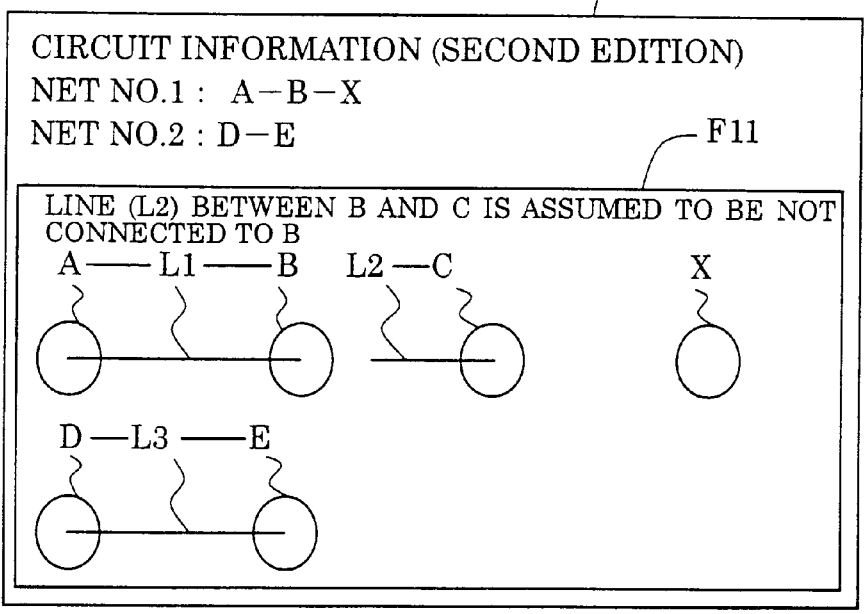

FIGS. 26A and 26B show additional embodiments of parts upon the circuit modification.

Particularly, FIG. 26A shows an existing printed wiring board 100, on which electronic parts 110 and 120 are mounted. The lands of the electronic part 120 are composed of lands P1–P3, and P4–P6.

FIG. 26B shows an electronic part 130 which has a higher level function than the electronic part 120, and the pin arrangement and the interval of the pins are different from those of the electronic part 120.

Now, when the circuit modification for modifying the electronic part 120 to the electronic part 130 becomes required to be performed, the lands P1–P6 can not be used. Accordingly, lands N1–N6 of the electronic part 130 have to be set outside of the printed wiring board 100. However, it has been impossible to set the same in the conventional circuit modification process.

The pattern input information table 40 of the present invention shown in FIG. 1 has the EC-NPLND land 44 which is an area for setting the external land. The data structure is prepared so as to treat the EC-NPLND land 44 as the same land as the part land 41, the manual land 42, and the via land 43.

Accordingly, except referring to the substance of the external lands N1–N6 at the EC-NPLND land 44, they can be treated in the same way as the other lands. As a result, it becomes possible to perform a high speed recognition of a connection upon the circuit modification including external parts.

As described above, a method of recognizing a connection of a reconstructing pattern in a printed wiring board according to the present invention is arranged such that a physical connection table is prepared which has a (forward) connecting direction address indicating a (forward) connection order of connecting elements with a predetermined connecting element being made a starting point and a backward connecting direction address indicating a backward connection order to the connection order, based on a pattern input information table indicating a physical state of the connecting elements. Therefore, it becomes possible to recognize the physical connection of the connecting elements of nets with a less storage capacity at a high speed.

Also, the method may be arranged such that lands and lines as the connecting elements are made to include a via, a manual land, an external land, and a jumper, the cutting of the lines is regarded as a temporarily cut line, the backward connecting direction address is set based on the connecting direction address, a connecting direction address and a backward connecting direction address corresponding to a circuit after modification are set based on the connecting direction address and the backward connecting direction address, and preferably the connecting direction address is set with only the connection order of a connecting route from the starting land to a second land being reversed and the second land being made a starting point. Therefore, it becomes possible to recognize the physical connection of the connecting elements including external parts at a high speed for performing a circuit modification process.

Furthermore, the method may be arranged such that the large area pattern is regarded as one of a peripheral line, a punching line, an imaginary line, and a cutting line of the above-mentioned lines and the connecting elements are made to include the large area pattern. Therefore, it becomes possible to recognize the physical connection of the connecting elements including the large area pattern and the cutting pattern for setting a priority order of the cutting of the lines.

I claim:

1. A method of recognizing a connection of a reconstructing pattern in a printed wiring board with a plurality of nets for performing a circuit modification after a printed board wiring, comprising the step of;

preparing a physical connection table, corresponding to each net, which has a connecting direction address indicating a connection order of connecting elements with a predetermined connecting element being made a starting point and a backward connecting direction address based on the connecting direction address and indicating a backward connection order and, which enables a physical connection of the connecting elements to be recognized, based on a pattern input information table indicating a physical state of the connecting elements.

2. The method of recognizing a connection of a reconstructing pattern in a printed wiring board as claimed in claim 1 wherein the connecting direction address and the backward connecting direction address are modified to a connecting direction address and a backward connecting direction address corresponding to a modified circuit to recognize the physical connection.

3. The method of recognizing a connection of a reconstructing pattern in a printed wiring board as claimed in claim 1 wherein the connecting elements include a land and a line, and wherein the land includes a via, a manual land, and an external land for parts which are not mounted on the printed wiring board, and the line includes a jumper for mutually connecting the connecting elements on the printed wiring board the external land and the connecting elements, and more than one external land.

4. The method of recognizing a connection of a reconstructing pattern in a printed wiring board as claimed in claim 3 wherein the predetermined connecting element includes a land, and the connecting direction address is set with only a connection order from a starting land set in the physical connection table to a second land being reversed and the second land being made a starting point.

5. The method of recognizing a connection of a reconstructing pattern in a printed wiring board as claimed in claim 3 wherein whether or not a line, whose backward connecting direction address indicates that the line is not connected, is physically connected to a second connecting element is determined based on the pattern input information table, and when the line is connected it is recognized that a net, which includes the line, includes a loop pattern.

6. The method of recognizing a connection of a reconstructing pattern in a printed wiring board as claimed in claim 3 wherein a cutting of a line is recognized by being regarded as a temporarily cut line, and a jumper is recognized by being regarded as a line between the connecting elements.

7. The method of recognizing a connection of a reconstructing pattern in a printed wiring board as claimed in claim 3 wherein a physical connection table where two nets are connected with a jumper to form a single net is prepared by combining a physical connection table of two nets and a physical connection table of the jumper, and the connecting direction address and the backward connecting direction address of the combined physical connection table are based on the connecting direction address and the backward connecting direction address of an original physical connection table.

8. The method of recognizing a connection of a reconstructing pattern in a printed wiring board as claimed in claim 3 wherein the connecting elements further include a large area pattern, and the large area pattern is regarded as including one of a peripheral line of the large area pattern, a punching line of the large area pattern, and an imaginary line connecting the peripheral line and the punching line.

9. The method of recognizing a connection of a reconstructing pattern in a printed wiring board as claimed in claim 8 wherein a land directly connected to the large area pattern or included in the large area pattern is regarded as being directly or indirectly connected to the peripheral line, the punching line, the imaginary line, or a land directly connected to one of these lines with a second imaginary line.

10. The method of recognizing a connection of a reconstructing pattern in a printed wiring board as claimed in claim 8 wherein a cutting of the large area pattern is recognized by cutting at least one of the peripheral line and the punching line and by adding a second imaginary line.

11. The method of recognizing a connection of a reconstructing pattern in a printed wiring board as claimed in claim 9 wherein a separation of a land directly connected to the large area pattern or included in the large area pattern from the large area pattern is recognized by cutting at least one of the peripheral line, the punching line and the second imaginary line.

12. The method of recognizing a connection of a reconstructing pattern in a printed wiring board as claimed in claim 3 wherein a cutting of a land is recognized by cutting a peripheral line of the land and by adding an imaginary line.

13. The method of recognizing a connection of a reconstructing pattern in a printed wiring board as claimed in claim 8 wherein a line cut by a circuit modification is provided with a priority order of cutting.

14. The method of recognizing a connection of a reconstructing pattern in a printed wiring board as claimed in claim 8 wherein a net includes attributes of a signal pattern of an MST wiring, a single stroke drawing-wiring, or a single stroke drawing-wiring for designating a connection order, or of a large area connecting pattern including a loop pattern, and when an attribute is the large area connecting pattern, the connection order of the connecting elements is determined by using a connecting element-unique decision method.

* * * * *